(12) United States Patent
Hidaka et al.

(10) Patent No.: US 11,842,914 B2
(45) Date of Patent: Dec. 12, 2023

(54) COMPOSITE SINTERED BODY, ELECTROSTATIC CHUCK MEMBER, AND ELECTROSTATIC CHUCK DEVICE

(71) Applicant: SUMITOMO OSAKA CEMENT CO., LTD., Tokyo (JP)

(72) Inventors: Nobuhiro Hidaka, Tokyo (JP); Hironori Kugimoto, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 1176 days.

(21) Appl. No.: 16/480,264

(22) PCT Filed: Feb. 19, 2018

(86) PCT No.: PCT/JP2018/005719
§ 371 (c)(1),
(2) Date: Jul. 23, 2019

(87) PCT Pub. No.: WO2018/155374
PCT Pub. Date: Aug. 30, 2018

(65) Prior Publication Data
US 2019/0385884 A1 Dec. 19, 2019

(30) Foreign Application Priority Data

Feb. 23, 2017 (JP) .................................. 2017-032622
Feb. 23, 2017 (JP) .................................. 2017-032623

(51) Int. Cl.
*H01L 21/683* (2006.01)
*C04B 35/103* (2006.01)
(Continued)

(52) U.S. Cl.
CPC ........ *H01L 21/6833* (2013.01); *C04B 35/103* (2013.01); *H01J 37/32724* (2013.01);
(Continued)

(58) Field of Classification Search
CPC .............. H01L 21/6833; C04B 35/103; H01J 37/32724
See application file for complete search history.

(56) References Cited

U.S. PATENT DOCUMENTS

| 4,681,861 A * | 7/1987 | Saito ..................... C04B 35/565 |
| | | 501/91 |
| 2009/0197073 A1* | 8/2009 | Nakayama ............ C04B 35/117 |
| | | 428/325 |

(Continued)

FOREIGN PATENT DOCUMENTS

| JP | H05-178657 A | 7/1993 |
| JP | H06-157132 A | 6/1994 |

(Continued)

OTHER PUBLICATIONS

Schmid,H.K. et al., Microstructural Characterization of Al2O3-SiC Nanocomposites, Journal of the European Ceramic Society, vol. 18: 39-49 (1998).

(Continued)

*Primary Examiner* — Scott Bauer
(74) *Attorney, Agent, or Firm* — Merchant & Gould P.C.

(57) ABSTRACT

This composite sintered body is a ceramic composite sintered body which includes aluminum oxide which is a main phase, and silicon carbide which is a sub-phase, the composite sintered body including an interface layer which includes, as a forming material, a material other than the aluminum oxide and the silicon carbide, at an interface between a crystal grain of the aluminum oxide and a crystal grain of the silicon carbide in a grain boundary.

20 Claims, 10 Drawing Sheets

(51) Int. Cl.
*H01J 37/32* (2006.01)
*H01L 21/67* (2006.01)

(52) U.S. Cl.
CPC .............. *H01L 21/67103* (2013.01); *C04B 2235/3217* (2013.01); *C04B 2235/3826* (2013.01); *C04B 2235/785* (2013.01); *C04B 2235/786* (2013.01); *C04B 2235/85* (2013.01); *C04B 2235/9669* (2013.01); *H01J 2237/002* (2013.01)

(56) References Cited

U.S. PATENT DOCUMENTS

| 2010/0327204 | A1* | 12/2010 | Yashima | F16K 41/02 |
| | | | | 251/304 |
| 2015/0251957 | A1* | 9/2015 | Funaki | F16C 33/145 |
| | | | | 501/87 |
| 2016/0109125 | A1* | 4/2016 | Willkens | F23Q 7/001 |
| | | | | 219/270 |
| 2017/0057875 | A1 | 3/2017 | Ishizuka et al. | |

FOREIGN PATENT DOCUMENTS

| JP | 108-267305 A | 10/1996 |
| JP | H10-279349 A | 10/1998 |
| JP | H11-171647 A | 6/1999 |
| JP | 2006-206376 A | 8/2006 |
| JP | 4744855 B | 8/2011 |
| WO | 2015/137270 A1 | 9/2015 |

OTHER PUBLICATIONS

International Search Report for PCT/JP2018/005719 (dated May 15, 2018).
Office Action for Japanese Patent Application No. 2018-540079 (dated Oct. 30, 2018).

* cited by examiner

COMPOSITE SINTERED BODY, ELECTROSTATIC CHUCK MEMBER, AND ELECTROSTATIC CHUCK DEVICE

TECHNICAL FIELD

The present invention relates to a composite sintered body, an electrostatic chuck member, and an electrostatic chuck device.

This application is a U.S. National Stage Application under 35 U.S.C. 071 of International Patent Application No. PCT/JP2018/005719, filed on Feb. 19, 2018, which claims the benefit of priority to Japanese Patent Application No. 2017-032622 filed on Feb. 23, 2017 and Japanese Patent Application No. 2017-032623, filed on Feb. 23, 2017, the disclosures of all of which are hereby incorporated by reference in their entireties. The International Application was published in Japanese on Aug. 30, 2018 as WO 2018/155374.

BACKGROUND

In recent years, a semiconductor manufacturing apparatus which performs a plasma process has an electrostatic chuck device. In the electrostatic chuck device, a plate-shaped sample (for example, a wafer) can be easily mounted on and fixed to a sample stage. Further, the electrostatic chuck device can maintain a temperature of the wafer at a desired temperature. The electrostatic chuck device is provided with an electrostatic attraction electrode that generates an electrostatic force (Coulomb's force) between a base having one principal surface which is a pacing surface on which the wafer is placed, and the wafer placed on the placing surface (refer to, for example, Patent Literature No. 1).

For example, In a case where the electrostatic chuck device as described above is used in the plasma process, the base on which the wafer is placed is heated to a high temperature by plasma. For this reason, the base is formed using a ceramic material having heat resistance and insulating properties.

In such an electrostatic chuck device, the wafer is fixed by using the electrostatic force generated between the wafer and the electrostatic attraction electrode. That is, when the electrostatic chuck device fixes the wafer, voltage is applied to the electrostatic attraction electrode to generate an electrostatic force between the wafer and the electrostatic attraction electrode. On the other hand, when removing the wafer fixed to the placing surface of the electrostatic chuck device, the application of the voltage to the electrostatic attraction electrode is stopped to make the electrostatic force between the wafer and the electrostatic attraction electrode disappear.

CITATION LIST

Patent Literature

[Patent Literature No. 1] Japanese Patent No. 4744855

SUMMARY OF INVENTION

Technical Problem

However, in an electrostatic chuck device of the related art, for example, when an attempt to remove the wafer is made after the plasma process is carried out, an adsorption force remains between the heated placing surface and the wafer, and thus there is a case where it becomes difficult to remove the wafer. If such a situation occurs, work efficiency decreases, and therefore, improvement is required.

Further, devices using a semiconductor tend to be highly integrated. At the time of manufacture of a device using a semiconductor, miniaturization of wiring (also referred to as a microfabrication technique) or 3D formation (also referred to as a three-dimensional mounting technique) is required. For this reason, the use conditions of a semiconductor manufacturing apparatus and an electrostatic chuck device which is used in the semiconductor manufacturing apparatus have become severe. In accordance with such a change in use condition, an electrostatic chuck device capable of treating a wafer with high yield is required. The semiconductor manufacturing apparatus is required to (i) reduce an in-plane temperature distribution (temperature difference) of a wafer, and (ii) be able to reliably carry out a deep drilling processing technique.

In this specification, there is a case where the "degree of in-plane temperature distribution (temperature difference) of a wafer placed on a sample stage" is referred to as "temperature uniformity". "High temperature uniformity" means that the in-plane temperature distribution of the wafer is small.

In the electrostatic chuck device, (i) in order to reduce an in-plane temperature distribution (temperature difference) of a wafer, a technique for cooling a wafer placed on a sample stage by providing minute grooves in the sample stage and making a gas refrigerant (for example, helium) flow in the grooves is known. In order to enhance temperature uniformity in such an electrostatic chuck device, it is conceivable to increase a gas pressure of the refrigerant to improve cooling efficiency. On the other hand, in a case of increase the gas pressure of the refrigerant, the electrostatic chuck device is required to have a high adsorption force such that the wafer is not detached due to the pressure received from the refrigerant. In order to obtain the high adsorption force, it is preferable that the relative dielectric constant of a base of the electrostatic chuck device is high.

Further, in a semiconductor manufacturing apparatus using the electrostatic chuck device, (ii) in order to reliably carry out a deep drilling processing technique, an applied voltage at the time of the processing tends to increase. For this reason, a high withstand voltage is required for the electrostatic chuck device.

However, it is known that the relative dielectric constant and the withstand voltage are in a contradictory relationship. For this reason, a ceramic sintered body having both the relative dielectric constant and the withstand voltage is required.

Further, an electrostatic chuck device capable of improving productivity is required.

The present invention has been made in view of such circumstances and has an object to provide a composite sintered body which can be suitably used in an electrostatic chuck device, can improve productivity, and has both a high relative dielectric constant and a high withstand voltage. Further, the present invention has an object to provide an electrostatic chuck member and an electrostatic chuck device using such a composite sintered body.

Solution to Problem

A ceramic material that is a material for forming a base becomes easy to electrically conduct if it is heated, and thus a voltage (withstand voltage) at which insulation breakdown occurs decreases. As described above, the electrostatic chuck device is heated to a high temperature in a plasma process. For this reason, in the electrostatic chuck device using a ceramic material as the material for forming the base, depending on the use condition, the base with the lowered withstand voltage is subjected to insulation breakdown, and thus a semiconductor element, a wiring pattern, or the like to be treated in the plasma process is damaged, so that there is a concern that a yield may be lowered.

The inventors have focused on the above phenomenon of the ceramic material. That is, if the withstand voltage of the ceramic material which is used as the material for forming the base is not easily lowered even under a high-temperature condition, it was thought that the insulation breakdown of the base is prevented, so that the yield can be improved.

Further, as a result of studies by the inventors, it was found that when the electrostatic chuck device is heated to a high temperature by plasma or a built-in heater, the electric resistance value (volume resistivity value) of the base serving as the placing surface on which the wafer is placed is lowered, and thus it becomes easy to conduct electricity, and it is one of the factors of the above problem. If the volume resistivity value decreases when the base becomes hot, even after the voltage application to the electrostatic attraction electrode is stopped, it is difficult to eliminate polarization, and the fact that the Coulomb's force tends to remain is considered to be one of the factors that make removal of the wafer difficult.

The inventors have completed the present invention as a result of intensive studies based on these thoughts.

According to an aspect of the present invention, there is provided a composite sintered body which is a ceramic composite sintered body, the composite sintered body including aluminum oxide which is a main phase; silicon carbide which is a sub-phase; and an interface layer which includes, as a forming material, a material other than the aluminum oxide and the silicon carbide, at an interface between the crystal grain of the aluminum oxide and the crystal grain of the silicon carbide in a grain boundary.

In the above aspect of the present invention, a thickness of the interface layer may be 0.6 nm or more and 2.5 nm or less.

In the above aspect of the present invention, a volume resistivity value may be $5 \times 10^{15}$ Ω·cm or more in an entire range from room temperature to 300° C.

According to another aspect of the present invention, there is provided a composite sintered body which is a ceramic composite sintered body, the composite sintered body including aluminum oxide which is a main phase; and silicon carbide which is a sub-phase, in which an average crystal grain size of the aluminum oxide is 0.8 μm or more and 1.2 μm or less, the crystal grains of the silicon carbide are dispersed in the crystal grains of the aluminum oxide and at crystal grain boundaries between the crystal grains of the aluminum oxide, and the proportion of the number of crystal grains of the silicon carbide dispersed in the crystal grains of the aluminum oxide is 50% or more and 60% or less with respect to the total number of crystal grains of the silicon carbide.

In the above aspect of the present invention, an average crystal grain size of the crystal grains of the silicon carbide dispersed in the crystal grains of the aluminum oxide may be smaller than an average crystal grain size of the crystal grains of the silicon carbide dispersed at the crystal grain boundaries of the aluminum oxide.

Further, according to an aspect of the present invention, there is provided an electrostatic chuck member including a plate-shaped base which includes, as a forming material, the composite sintered body described above, the base having one principal surface which is a placing surface on which a plate-shaped sample is placed, and an electrostatic attraction electrode provided on the side opposite to the placing surface of the base, or in an interior of the base.

Further, according to an aspect of the present invention, there is provided an electrostatic chuck device including the electrostatic chuck member described above, and cooling means for cooling the plate-shaped sample placed on the placing surface, in which a plurality of projection portions supporting the plate-shaped sample are provided on the placing surface, and the cooling means supplies heat transfer gas between the plurality of projection portions.

In other words, the present invention has the following aspects.

[1] A composite sintered body which is a ceramic composite sintered body, the composite sintered body comprising: aluminum oxide which is a main phase; silicon carbide which is a sub-phase; at least one crystal grain of the silicon carbide, which is located between at least two crystal grains of the aluminum oxide; and an interface layer which includes, as a forming material, a material other than the aluminum oxide and the silicon carbide, at a grain boundary between the crystal grain of the aluminum oxide and the crystal grain of the silicon carbide.

[2] The composite sintered body according to the above [1], in which a thickness of the interface layer is 0.6 nm or more and 2.5 nm or less.

[3] The composite sintered body according to the above [1] or [2], in which a volume resistivity value is $5 \times 10^{15}$ Ω·cm or more in an entire range from room temperature to 300° C.

[4] The composite sintered body according to any one of the above [1] to [3], in which an average crystal grain size of the aluminum oxide is 0.8 μm or more and 1.2 μm or less, the crystal grains of the silicon carbide are dispersed in the crystal grains of the aluminum oxide and at grain boundaries between the crystal grains of the aluminum oxide, and the proportion of the number of crystal grains of the silicon carbide dispersed in the crystal grains of the aluminum oxide is 50% or more and 60% or less with respect to the total number of crystal grains of the silicon carbide.

[5] The composite sintered body according to the above [4], in which an average crystal grain size of the crystal grains of the silicon carbide dispersed in the crystal grains of the aluminum oxide is smaller than an average crystal grain size of the crystal grains of the silicon carbide dispersed at the crystal grain boundaries of the aluminum oxide.

[6] A composite sintered body which is a ceramic composite sintered body, the composite sintered body comprising: aluminum oxide which is a main phase; and silicon carbide which is a sub-phase, wherein an average crystal grain size of the aluminum oxide is 0.8 μm or more and 1.2 μm or less, crystal grains of the silicon carbide are dispersed in crystal grains of the aluminum oxide and at grain boundaries between the crystal grains of the aluminum oxide, and a proportion of the number of crystal grains of the silicon carbide dispersed in the crystal grains of the aluminum oxide is 50% or more and 60% or less with respect to the total number of crystal grains of the silicon carbide.

[7] The composite sintered body according to the above [6], in which an average crystal grain size of the crystal grains of the silicon carbide dispersed in the crystal grains of the aluminum oxide is smaller than an average crystal grain size of the crystal grains of the silicon carbide dispersed at the crystal grain boundaries of the aluminum oxide.

[8] An electrostatic chuck member including: a base which includes, as a forming material, the composite sintered body according to any one of the above [1] to [7], the base having one principal surface which is a placing surface on which a plate-shaped sample is placed; and an electrostatic attraction electrode provided on a principal surface of the base on a side opposite to the one principal surface of the base, or in an interior of the base.

[9] An electrostatic chuck device including: the electrostatic chuck member according to the above [8]; and cooling means for cooling the plate-shaped sample placed on the placing surface, wherein a plurality of projection portions supporting the plate-shaped sample are provided on the placing surface, and the cooling means supplies heat transfer gas between the plurality of projection portions.

Advantageous Effects of Invention

According to the present invention, it is possible to provide a composite sintered body for an electrostatic chuck, which can be suitably used in an electrostatic chuck device and can improve productivity. It is possible to provide a composite sintered body has both a high relative dielectric constant and a high withstand voltage. It is possible to provide an electrostatic chuck member and an electrostatic chuck device using such a composite sintered body for an electrostatic chuck.

DESCRIPTION OF EMBODIMENTS

Hereinafter, an electrostatic chuck device, a composite sintered body, and the like according to the present embodiment will be described with reference to the drawings. Preferred examples or conditions may be shared by a plurality of embodiments below. Further, a change, an omission, substitution, and the like may be made with respect to the number, the amount, the position, the shape, and the like within a scope which does not depart from the gist of the present invention. In all the following drawings, in order to make the drawings easy to see, there is a case where dimensions, a ratio, or the like of each constituent element is appropriately changed.

[Electrostatic Chuck Device]

Figure 1:
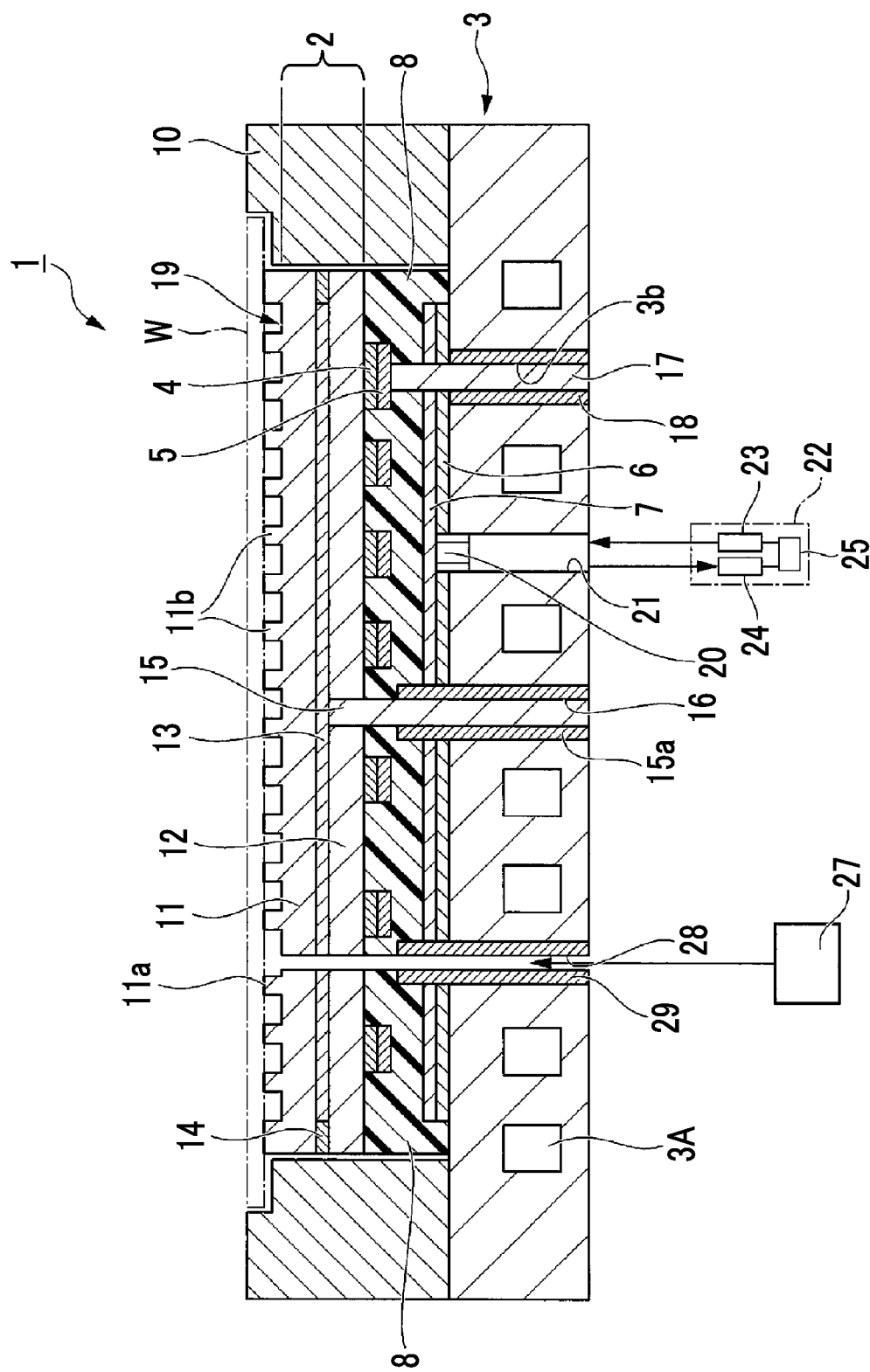
FIG. 1 is a schematic sectional view showing an electrostatic chuck device in an aspect of the present invention.

FIG. 1 is a sectional view showing an electrostatic chuck device of the present embodiment. An electrostatic chuck device 1 of this embodiment is provided with an electrostatic chuck part 2 and a temperature adjusting base part 3. The electrostatic chuck part 2 has a disk shape when viewed in a plan view, having a placing surface on the one principal surface (upper surface) side. The temperature adjusting base part 3 is provided below the electrostatic chuck part 2 to adjust the temperature of the electrostatic chuck part 2 to a desired temperature. The temperature adjusting base part 3 has a thick disk shape when viewed in a plan view. Further, the electrostatic chuck part 2 and the temperature adjusting base part 3 are bonded to each other through an adhesive layer 8 provided between the electrostatic chuck part 2 and the temperature adjusting base part 3.

Hereinafter, these constituent elements will be described in order.

(Electrostatic Chuck Part)

The electrostatic chuck part 2 (also referred to as an electrostatic chuck member) has a placing plate 11, a supporting plate 12, an electrostatic attraction electrode 13, and an insulating material layer 14. The upper surface of the placing plate 11 serves as a placing surface 11a on which a plate-shaped sample W such as a semiconductor wafer is placed. The supporting plate 12 is integrated with the placing plate 11. The supporting plate 12 supports the bottom portion side of the placing plate 11. The electrostatic attraction electrode 13 is provided between the placing plate 11 and the supporting plate 12. The insulating material layer 14 insulates the surroundings of the electrostatic attraction electrode 13. The placing plate 11 and the supporting plate 12 correspond to a "base" in the present invention. In other words, the base is composed of the placing plate 11 and the supporting plate 12.

As another aspect, the electrostatic chuck member includes a base having one principal surface which is a placing surface on which a plate-shaped sample is placed, and an electrostatic attraction electrode provided on a principal surface on the side opposite to the one principal surface of the base or in the interior of the base.

As described above, in the electrostatic chuck device, (i) in order to reduce an in-plane temperature distribution (temperature difference) of a wafer, a technique for cooling the wafer placed on a sample stage by providing minute grooves in the sample stage and making a gas refrigerant (for example, helium) flow in the grooves is known. In order to enhance temperature uniformity in such an electrostatic chuck device, it is conceivable to increase a gas pressure of the refrigerant to improve cooling efficiency. On the other hand, in a case of increase the gas pressure of the refrigerant, the electrostatic chuck device is required to have a high adsorption force such that the wafer is not detached due to the pressure received from the refrigerant.

In view of the above, in this embodiment, in order to obtain a high adsorption force of the placing plate 11 with respect to the plate-shaped sample W, the relative dielectric constant of each of the placing plate 11 and the supporting plate 12 which configure the base of the electrostatic chuck device is 12 or more and preferably, 13 or more. The upper limit value of the relative dielectric constant of each of the placing plate 11 and the supporting plate 12 is not particularly limited. However, it is about 14.

Further, in a semiconductor manufacturing apparatus using the electrostatic chuck device, (ii) in order to reliably carry out a deep drilling processing technique, an applied voltage at the time of the processing tends to increase. For this reason, a high withstand voltage is required for the electrostatic chuck device.

In view of the above, in order not to damage the base of the electrostatic chuck device under a processing condition at the time of deep drilling processing, the withstand voltage of each of the placing plate and the supporting plate 12 which configure the base of this embodiment is 19 kV or more and preferably, 16 kV or more. The upper limit value of the withstand voltage of each of the placing plate 11 and the supporting plate 12 is not particularly limited. However, it is about 25 kV.

The placing plate 11 and the supporting plate 12 are disk-shaped members in which the shapes of superimposed surfaces are the same. Each of the placing plate 11 and the supporting plate 12 has mechanical strength. Each of the placing plate 11 and the supporting plate 12 is made of a ceramic sintered body having durability against corrosive gas and plasma thereof. The material for forming the placing plate 11 and the supporting plate 12 will be described in detail later.

A plurality of projection portions 11b each having a diameter smaller than the thickness of the plate-shaped sample W are formed at predetermined intervals on the placing surface 11a of the placing plate 11. The projection portions 11b support the plate-shaped sample W.

The thickness of the entirety including the placing plate 11, the supporting plate 12, the electrostatic attraction electrode 13, and the insulating material layer 14, that is, the thickness of the electrostatic chuck part 2 is 0.7 mm or more and 5.0 mm or less, as an example. The thickness of the electrostatic chuck part 2 includes the projection portion 11b. In other words, the thickness of the electrostatic chuck part 2 is the minimum dimension from the surface of the supporting plate 12 on the side opposite to the surface of the supporting plate 12, which is in contact with the electrostatic attraction electrode 13, to the upper surface of the projection portion 11b.

For example, if the thickness of the electrostatic chuck part 2 falls below 0.7 mm, it becomes difficult to secure the mechanical strength of the electrostatic chuck part 2. In other words, if the thickness of the electrostatic chuck part 2 is 0.7 mm or more, it is possible to secure the mechanical strength of the electrostatic chuck part 2. If the thickness of the electrostatic chuck part 2 exceeds 5.0 mm, the thermal capacity of the electrostatic chuck part 2 is increased. In this way, the thermal responsiveness of the plate-shaped sample W placed thereon deteriorates, and thus the heat transfer in a lateral direction of the electrostatic chuck part increases. Accordingly, it becomes difficult to maintain the in-plane temperature of the plate-shaped sample W at a desired temperature pattern. That is, if the thickness of the electrostatic chuck part 2 is 5.0 mm or less, the thermal capacity of the electrostatic chuck part 2 becomes an appropriate value, and thus deterioration of the thermal responsiveness of the plate-shaped sample W placed thereon, or an increase in the heat transfer in the lateral direction of the electrostatic chuck part is suppressed. Accordingly, it is possible to maintain the in-plane temperature of the plate-shaped sample W at a desired temperature pattern. The thickness of each part described here is an example and is not limited to the range described above.

The electrostatic attraction electrode 13 is used as an electrostatic chucking electrode for generating electric charges and fixing the plate-shaped sample W with an electrostatic attraction force. The shape or the size of the electrostatic attraction electrode 13 is appropriately adjusted according to the use thereof.

The electrostatic attraction electrode 13 is preferably formed of conductive ceramics such as an aluminum oxide-tantalum carbide ($Al_2O_3$—$Ta_4C_5$) conductive composite sintered body, an aluminum oxide-tungsten ($Al_2O_3$—W) conductive composite sintered body, an aluminum oxide-silicon carbide ($Al_2O_3$—SiC) conductive composite sintered body, an aluminum nitride-tungsten (AlN—W) conductive composite sintered body, an aluminum nitride-tantalum (AlN—Ta) conductive composite sintered body, or an yttrium oxide-molybdenum ($Y_2O_3$—Mo) conductive composite sintered body, or high melting point metal such as tungsten (W), tantalum (Ta), or molybdenum (Mo).

The thickness of the electrostatic attraction electrode 13 is not particularly limited. However, for example, a thickness of 0.1 µm or more and 100 µm or less can be selected, and a thickness of 5 µm or more and 20 µm or less is more preferable.

If the thickness of the electrostatic attraction electrode 13 falls below 0.1 µm, it becomes difficult to secure sufficient electrical conductivity. In other words, if the thickness of the electrostatic attraction electrode 13 is 0.1 µm or more, it is possible to secure sufficient electrical conductivity. If the thickness of the electrostatic attraction electrode 13 exceeds 100 µm, cracking easily occurs in the joint interfaces between the electrostatic attraction electrode 13, and the placing plate 11 and the supporting plate 12 due to a difference in coefficient of thermal expansion between the electrostatic attraction electrode 13, and the placing plate 11 and the supporting plate 12. In other words, if the thickness of the electrostatic attraction electrode 13 is 100 µm or less, cracking does not easily occur in the joint interfaces between the electrostatic attraction electrode 13, and the placing plate 11 and the supporting plate 12.

The electrostatic attraction electrode 13 having such a thickness can be easily formed by a film formation method such as a sputtering method or a vapor deposition method, or a coating method such as a screen printing method.

The insulating material layer 14 surrounds the electrostatic attraction electrode 13 to protect the electrostatic attraction electrode 13 from corrosive gas and plasma thereof. The insulating material layer 14 joins and integrates a boundary portion between the placing plate 11 and the supporting plate 12, that is, an outer peripheral portion region except for the electrostatic attraction electrode 13. In other words, the insulating material layer 14 is interposed between the placing plate 11 and the supporting plate 12 and is located in a region surrounding the outer periphery of the electrostatic attraction electrode 13 to bond and fix the placing plate 11, the supporting plate 12, and the electrostatic attraction electrode 13 to each other. The insulating material layer 14 is formed of an insulating material having the same composition or the same main component as the material configuring the placing plate 11 and the supporting plate 12.

(Temperature Adjusting Base Part)

The temperature adjusting base part 3 adjusts the temperature of the electrostatic chuck part 2 to a desired temperature. The temperature adjusting base part 3 has a thick disk shape. As the temperature adjusting base part 3, for example, a liquid-cooling base or the like, in which a flow path 3A for circulating a refrigerant is formed in the interior thereof, is suitable.

As a material configuring the temperature adjusting base part 3, as long as it is metal which has excellent thermal conductivity, electrical conductivity, and workability, or a compound material which includes the metal, there is no particular limitation. For example, aluminum (Al), an aluminum alloy, copper (Cu), a copper alloy, stainless steel (SUS), or the like can be suitably used. It is preferable that at least the surface which is exposed to plasma, of the temperature adjusting base part 3, is subjected to alumite treatment or has an insulating film such as alumina formed thereon.

An insulating plate 7 is bonded to the upper surface side of the temperature adjusting base part 3 through an adhesion layer 6. The adhesion layer 6 is made of a sheet-shaped or film-shaped adhesive resin having heat resistance and insulating properties, such as polyimide resin, silicone resin, or epoxy resin. The adhesion layer is formed in a thickness in a range of about 5 µm to 100 µm, for example. The insulating plate 7 is made of a thin plate, a sheet, or a film of resin having heat resistance, such as polyimide resin, epoxy resin, or acrylic resin.

The insulating plate 7 may be an insulating ceramic plate instead of a resin sheet, or may be a thermally sprayed film having insulating properties, such as alumina.

(Focus Ring)

A focus ring 10 is a member that has a ring shape when viewed in a plan view and is placed on a peripheral portion of the temperature adjusting base part 3. The focus ring 10 is formed of, for example, a material having electrical conductivity equivalent to that of the plate-shaped sample W (wafer) which is placed on the placing surface. By disposing the focus ring 10, it is possible to make an electrical environment with respect to plasma substantially coincide with that in the wafer at a peripheral portion of the wafer. Accordingly, it is possible to make it difficult for a difference or bias in plasma treatment to occur between the central portion and the peripheral portion of the wafer.

(Other Members)

A power supply terminal 15 for applying a direct-current voltage to the electrostatic attraction electrode 13 is connected to the electrostatic attraction electrode 13. The power supply terminal 15 is inserted into a through-hole 16 penetrating the temperature adjusting base part 3, the adhesive layer 8, and the supporting plate 12 in a thickness direction. An insulator 15a having insulating properties is provided on the outer periphery side of the power supply terminal 15. The power supply terminal 15 is insulated from the temperature adjusting base part 3 made of metal, by the insulator 15a.

In FIG. 1, the power supply terminal 15 is shown as an integral member. However, the power supply terminal 15 may be configured by electrically connecting a plurality of members. The power supply terminal 15 is inserted into the temperature adjusting base part 3 and the supporting plate 12, which have different coefficients of thermal expansion. For this reason, it is favorable if, for example, a portion which is inserted into the temperature adjusting base part 3 and a portion which is inserted into the supporting plate 12 are made of different materials.

As the material of the portion (extraction electrode) connected to the electrostatic attraction electrode 13 and inserted into the supporting plate 12, of the power supply terminal 15, as long as it is a conductive material having excellent heat resistance, there is no particular limitation. However, a material having a coefficient of thermal expansion which is close to the coefficients of thermal expansion of the electrostatic attraction electrode 13 and the supporting plate 12 is preferable. For example, it is made of a conductive ceramic material such as $Al_2O_3$—TaC.

The portion inserted into the temperature adjusting base part 3, of the power supply terminal 15, is made of a metal material such as tungsten (W), tantalum (Ta), molybdenum (Mo), niobium (Nb), or a Kovar alloy, for example.

It is favorable if these two members are connected to each other with a silicone-based conductive adhesive having flexibility and resistance to electricity.

A heater element 5 is provided on the lower surface side of the electrostatic chuck part 2. The heater element 5 is, for example, a non-magnetic metal thin plate having a constant thickness of 0.2 mm or less, preferably about 0.1 mm. The heater element 5 is obtained by processing, for example, a titanium (Ti) thin plate, a tungsten (W) thin plate, a molybdenum (Mo) thin plate, or the like into a desired heater shape by a photolithography method or laser processing. As the heater shape, for example, a shape in which a band-like conductive thin plate meanders and the entire contour is an annular shape can be given.

The heater element 5 may be provided by bonding a non-magnetic metal thin plate to the electrostatic chuck part 2 and then processing and forming the non-magnetic metal thin plate on the surface of the electrostatic chuck part 2. The heater element 5 may be provided by transfer-printing the heater element 5 processed and formed at a position different from the electrostatic chuck part 2 onto the surface of the electrostatic chuck part 2.

The heater element 5 is bonded and fixed to the bottom surface of the supporting plate 12 by an adhesion layer 4. The adhesion layer 4 is made of a sheet-shaped or film-shaped silicone resin or acrylic resin having a uniform thickness and having heat resistance and insulating properties.

A power supply terminal 17 for supplying electric power to the heater element 5 is connected to the heater element 5. As the material configuring the power supply terminal 17, the same material as the material configuring the power supply terminal 15 described above can be used. The power supply terminal 17 is provided so as to fill a through-hole 3b formed in the temperature adjusting base part 3.

Further, a temperature sensor 20 is provided on the lower surface side of the heater element 5. In the electrostatic chuck device 1 of this embodiment, an installation hole 21 is formed so as to penetrate the temperature adjusting base part 3 and the insulating plate 7 in the thickness direction. The temperature sensor 20 is installed at the uppermost portion of the installation hole 21. It is preferable that the temperature sensor 20 is installed at a position as close to the heater element 5 as possible. For this reason, the installation hole 21 may be formed to extend so as to protrude further toward the adhesive layer 8 side from the structure shown in FIG. 1 such that the temperature sensor 20 and the heater element 5 are brought closer to each other.

As the temperature sensor 20, a fluorescent emission type temperature sensor can be given as an example. The fluorescent emission type temperature sensor is a temperature sensor in which a phosphor layer is formed on the upper surface side of a rectangular parallelepiped-shaped light transmission body made of quartz glass or the like. The temperature sensor 20 is bonded to the lower surface of the heater element 5 by a silicone resin-based adhesive or the like having translucency and heat resistance.

The phosphor layer is made of a material that generates fluorescence in response to heat input from the heater element 5. As the material for forming the phosphor layer, as long as it is a material generating fluorescence in response to heat generation, a wide variety of fluorescent materials can be selected. As the material for forming the phosphor layer, a fluorescent material to which a rare earth element having an energy level suitable for light emission is added, a semiconductor material such as AlGaAs, a metal oxide such as magnesium oxide, and a mineral such as ruby or sapphire can be given as an example, and a material appropriately selected from these materials can be used.

The temperature sensor 20 corresponding to the heater element 5 is provided at an arbitrary position which does not interfere with the power supply terminals 15 and 17 or the like and is in a circumferential direction of the lower surface of the heater element 5.

A temperature measurement part 22 measures the temperature of the heater element 5 from the fluorescence of the temperature sensor 20. The temperature measurement part 22 is composed of an excitation unit 23, a fluorescence detector 24, and a control unit 25, as an example. The excitation unit 23 irradiates the phosphor layer with excitation light on the outside (the lower side) of the installation hole 21 of the temperature adjusting base part 3. The fluorescence detector 24 detects the fluorescence emitted from the phosphor layer. The control unit 25 controls the excitation unit 23 and the fluorescence detector 24. Further, the control unit 25 calculates the temperature of a main heater, based on the fluorescence.

Further, the electrostatic chuck device 1 has a gas hole 28 provided so as to penetrate from the temperature adjusting base part 3 to the placing plate 11 in the thickness direction thereof. A tubular insulator 29 is provided at an inner peripheral portion of the gas hole 28.

A gas supply device (cooling means) 27 is connected to the gas hole 28. Cooling gas (heat transfer gas) for cooling the plate-shaped sample W is supplied from the gas supply device 27 through the gas hole 28. The cooling gas is supplied to grooves 19 which are formed between the plurality of projection portions 11b on the upper surface of the placing plate 11 through the gas hole to cool the plate-shaped sample W.

Further, the electrostatic chuck device 1 has a pin insertion hole (not shown) provided so as to penetrate from the temperature adjusting base part 3 to the placing plate 11 in the thickness direction thereof. The pin insertion hole can adopt the same configuration as that of the gas hole 28, for example. A lift pin for removal of the plate-shaped sample is inserted into the pin insertion hole.

The electrostatic chuck device 1 has the configuration as described above.

Hereinafter, composite sintered bodies of a first embodiment and a second embodiment will be described.

Composite Sintered Body of First Embodiment

First, a composite sintered body which is a material of the base (the placing plate 11 and the supporting plate 12) of the first embodiment will be described in detail.

Each of the placing plate 11 and the supporting plate 12 of the first embodiment is formed of a ceramic composite sintered body which includes aluminum oxide which is a main phase, and silicon carbide which is a sub-phase.

As one aspect of this embodiment, the composite sintered body is a ceramic composite sintered body which includes aluminum oxide which is a main phase; silicon carbide which is a sub-phase; at least one crystal grain of the silicon carbide, which is located between at least two crystal grains of the aluminum oxide; and has an interface layer which includes a material other than the aluminum oxide and the silicon carbide, at a grain boundary between one of the crystal grains of the aluminum oxide and the crystal grain of the silicon carbide.

In the composite sintered body of this embodiment, the mass ratio of the aluminum oxide to the silicon carbide is preferably in a range of 97:3 to 88:12, and more preferably in a range of 96:4 to 93:7.

In the composite sintered body of this embodiment, the average crystal grain size of the aluminum oxide is preferably 0.8 μm or more and 1.2 μm or less.

In this specification, an "average crystal grain size" is obtained by using a test piece obtained by cutting out a part of a composite sintered body, measuring the maximum dimension of arbitrary 200 crystal grains from an image taken by observing the surface of the test piece with a scanning electron microscope (SEM), and calculating the average value thereof.

Further, in the composite sintered body of this embodiment, the average crystal grain size of the silicon carbide is preferably 0.1 μm or more and 0.5 μm or less.

Further, the composite sintered body of this embodiment includes an interface layer which includes, as a forming material, a material other than aluminum oxide and silicon carbide, at an interface between a crystal grain of the aluminum oxide and a crystal grain of the silicon carbide in a grain boundary. In other words, the composite sintered body includes at least one crystal grain of the silicon carbide, which is located between at least two crystal grains of the aluminum oxide, and has an interface layer which includes a material other than aluminum oxide and silicon carbide, at a grain boundary between one of the crystal grains of the aluminum oxide and the crystal grain of the silicon carbide.

Here, a "grain boundary" refers to a boundary (interface) between crystal grains configuring the composite sintered body in the composite sintered body which is a polycrystalline sintered body. In the polycrystalline sintered body, the boundary between crystal grains with different crystal orientations become apparent as an interface.

The interface layer can be confirmed by using a test piece obtained by cutting out a part of the composite sintered body and observing the surface of the test piece with a transmission electron microscope (TEM).

The material of the interface layer is a "material other than aluminum oxide and silicon carbide", that is, a material which is neither aluminum oxide nor silicon carbide.

Here, assuming that the composite sintered body of this embodiment is a composite sintered body composed of aluminum oxide and silicon carbide, the elements configuring the interface layer are limited to four types of elements, aluminum (Al), oxygen (O), silicon (Si), and carbon (C). From the confirmation by the inventors, it was found that the interface layer of the composite sintered body of this embodiment was formed of a material other than aluminum oxide and silicon carbide. The material for forming the interface layer, that is, the material other than aluminum oxide and silicon carbide is presumed to be an oxide containing at least silicon atoms. Alternatively, it is also conceivable that the material is a mixed crystal of silicon carbide or aluminum oxide and an oxide containing silicon. These are likely to have high resistance compared to silicon carbide which is an electric conductor. As examples of the oxide containing silicon, silica and the like can be given.

From the above, the material other than aluminum oxide and silicon carbide contains at least oxygen and silicon and may optionally contain at least one of aluminum and carbon. The material other than aluminum oxide and silicon carbide may be an oxide containing silicon atoms or a mixed crystal of at least one of silicon carbide and aluminum oxide and an oxide containing silicon. More specifically, the material other than aluminum oxide and silicon carbide may be silica or a mixed crystal of at least one of silicon carbide and aluminum oxide and silica.

The composite sintered body having such an interface layer tends to have higher resistance.

First, the aluminum oxide which is a main phase, among the materials configuring the composite sintered body of this embodiment, is an insulator, and the silicon carbide which is a sub-phase is an electric conductor. Further, crystal grains of the silicon carbide are present at crystal grain boundaries of the aluminum oxide. That is, the crystal grain of the silicon carbide is present between at least two crystal grains of the aluminum oxide. For this reason, when an electric current is tried to flow through the composite sintered body, it is thought that electrons move along crystal grain boundaries of the aluminum oxide, in which crystal grains of the silicon carbide which is an electric conductor are disposed, rather than infiltrating into and moving in crystal grains of the aluminum oxide.

At this time, in the composite sintered body of this application, there is an interface layer which can become resistant to electrons moving along crystal grain boundaries. For this reason, the resistance of the whole becomes higher compared to a composite sintered body of the related art in which there is no interface layer.

In a composite sintered body in which an electric conductor and an insulator are mixed as in this embodiment, while the resistance value of the electric conductor (silicon carbide) increases with a rise in temperature, the resistance value of the insulator (aluminum oxide) decreases. Due to the balance between the two, in the composite sintered body, a volume resistivity tends to decrease in a high temperature region according to a rise in temperature. In the composite sintered body of this embodiment, due to the presence of the interface layer in which a temperature dependence of the volume resistivity is small, the volume resistivity does not easily decrease. As a result, high volume resistivity can be maintained even in a high temperature range.

In the composite sintered body of this embodiment, the volume resistivity value is preferably $5 \times 10^{15}$ Ω·cm or more in the entire range from room temperature (24° C.) to 300° C.

Here, the "range from room temperature (24° C.) to 300° C." is determined in consideration of the temperature condition of the use environment of the electrostatic chuck device. That is, in the electrostatic chuck device having the composite sintered body of this embodiment as a constituent material, the volume resistivity is maintained high in the range from room temperature (24° C.) to a temperature (300° C.) which exceeds a temperature assumed as a temperature condition in a plasma treatment process. For this reason, removal of the wafer in a high temperature region does not become difficult and a flow of an excessive current to the wafer is suppressed, whereby productivity is improved.

The thickness of the interface layer is preferably 0.6 nm or more and 2.5 nm or less. Here, the "thickness" of the interface layer corresponds to the distance between line segments when the interface layer is sandwiched between two parallel line segments in a transmission electron micrograph in which the interface layer can be confirmed. The thicknesses of arbitrary plural places (for example, five places) of the interface layer are measured in the same visual field, and the average value of the obtained measurement values is adopted as the "thickness of the interface layer".

If the thickness of the interface layer is 0.6 nm or more, conduction of electricity is difficult and a voltage (withstand voltage) at which insulation breakdown occurs is hard to be reduced.

On the other hand, if the thickness of the interface layer is 2.5 nm or less, the proportion of an interface layer with small polarizability does not increase too much, and a relative dielectric constant does not easily decrease. For this reason, in a case where the composite sintered body of this embodiment is adopted as the base of the electrostatic chuck device, it is possible to obtain a sufficient large electrostatic attraction force for fixing the wafer.

In silicon carbide (SiC), a large number of crystal structures are known, and silicon carbide having a 3C type (zincblende type) crystal structure in a cubic system, silicon carbide having a wurtzite type crystal structure in a hexagonal system of a 4H type, a 6H type, or the like, and silicon carbide having a 15R type crystal structure in a rhombohedral system can be given as examples. Among these, the silicon carbide having a 3C type crystal structure is referred to as "β-SiC". Further, all the silicon carbides having crystal structures other than the 3C type crystal structure are referred to as "α-SiC".

In the placing plate 11 and the supporting plate 12 of this embodiment, it is preferable that silicon carbide which is included in the composite sintered body is β-SiC. Further, in the composite sintered body, it is preferable that crystal grains of β-SiC are present to be dispersed in a state of being surrounded by crystal grains of aluminum oxide which is a matrix material. In the composite sintered body, the volume ratio of β-SiC is preferably 4% by volume or more and 15% by volume or less and more preferably 6% by volume or more and 10% by volume or less, with respect to the whole volume of the sintered body.

If the volume ratio of β-SiC is smaller than 4% by volume, the expression effect of electron conductivity by silicon carbide particles is small. Further, if the volume ratio of β-SiC is larger than 15% by volume, there is a concern that the silicon carbide particles may come into contact with each other to cause a decrease in resistance value through the silicon carbide particles.

Further, in the composite sintered body of this embodiment, the amount of metal impurities other than aluminum and silicon is preferably 100 ppm or less with respect to the total mass of the composite sintered body. The amount of metal impurities is preferably 50 ppm or less and more preferably 25 ppm or less, with respect to the total mass of the composite sintered body.

Here, elements to be focused on as metal impurities are calcium (Ca), chromium (Cr), iron (Fe), nickel (Ni), copper (Cu), sodium (Na), magnesium (Mg), potassium (K), titanium (Ti), manganese (Mn), zinc (Zn), barium (Ba), and yttrium (Y).

Composite Sintered Body of Second Embodiment

Next, a composite sintered body which is a material of the base (the placing plate 11 and the supporting plate 12) of the second embodiment will be described in detail.

Each of the placing plate 11 and the supporting plate 12 of this embodiment is formed of a ceramic composite sintered body which includes aluminum oxide which is a main phase, and silicon carbide which is a sub-phase.

As one aspect of this embodiment, the composite sintered body is a ceramic composite sintered body which includes aluminum oxide which is a main phase, and silicon carbide which is a sub-phase, wherein the average crystal grain size of the aluminum oxide is 0.8 µm or more and 1.2 µm or less, crystal grains of the silicon carbide are dispersed in crystal grains of the aluminum oxide and at crystal grain boundaries of the aluminum oxide, and the proportion of the number of the crystal grains of the silicon carbide dispersed in the crystal grains of the aluminum oxide is 50% or more and 60% or less with respect to the total number of crystal grains of the silicon carbide.

In the composite sintered body of this embodiment, the average crystal grain size of the aluminum oxide is 0.8 µm or more and 1.2 µm or less.

Further, in the composite sintered body of this embodiment, the crystal grains of the silicon carbide are dispersed in the crystal grains of the aluminum oxide and at the crystal grain boundaries between the crystal grains of the aluminum oxide.

Further, in the composite sintered body of this embodiment, the proportion of the number of crystal grains of the silicon carbide dispersed in the crystal grains of the aluminum oxide is 50% or more and 60% or less with respect to the total number of crystal grains of the silicon carbide. The proportion of the crystal grains of the silicon carbide dispersed in the crystal grains of the aluminum oxide tends to increase as the average crystal grain size of the aluminum oxide is larger.

In the present invention, the "proportion of the number of crystal grains of silicon carbide dispersed in crystal grains of aluminum oxide" in the composite sintered body is calculated based on the result of visually counting the crystal grains of silicon carbide in a scanning electron micrograph of any visual field of the composite sintered body. That is, the proportion of the number of crystal grains of silicon carbide dispersed in crystal grains of aluminum oxide is determined with 150 crystal grains of silicon carbide randomly extracted in an electron micrograph at a magnification of 10000 regarded as the "total number of crystal grains of silicon carbide". The same processing is carried out in electron micrographs of two visual fields, and the average value is determined as the "percentage of the number of crystal grains of silicon carbide dispersed in crystal grains of aluminum oxide".

The composite sintered body which is the material of each of the placing plate 11 and the supporting plate 12 can achieve both a high relative dielectric constant and a high withstand voltage with the configuration as described above.

In the composite sintered body of this embodiment, if the average crystal grain size of the aluminum oxide is increased, so that the proportion of the number of crystal grains of the silicon carbide dispersed in the crystal grains of the aluminum oxide increases, the relative dielectric constant tends to increase.

Further, in the composite sintered body of this embodiment, if the average crystal grain size of the aluminum oxide is increased, so that the proportion of the number of crystal grains of the silicon carbide dispersed in the crystal grains of the aluminum oxide is increased, the withstand voltage increases up to a certain average crystal grain size, and then the withstand voltage tends to decrease.

It is thought that the tendency of the change in withstand voltage can be explained by the following models.

Figure 6:
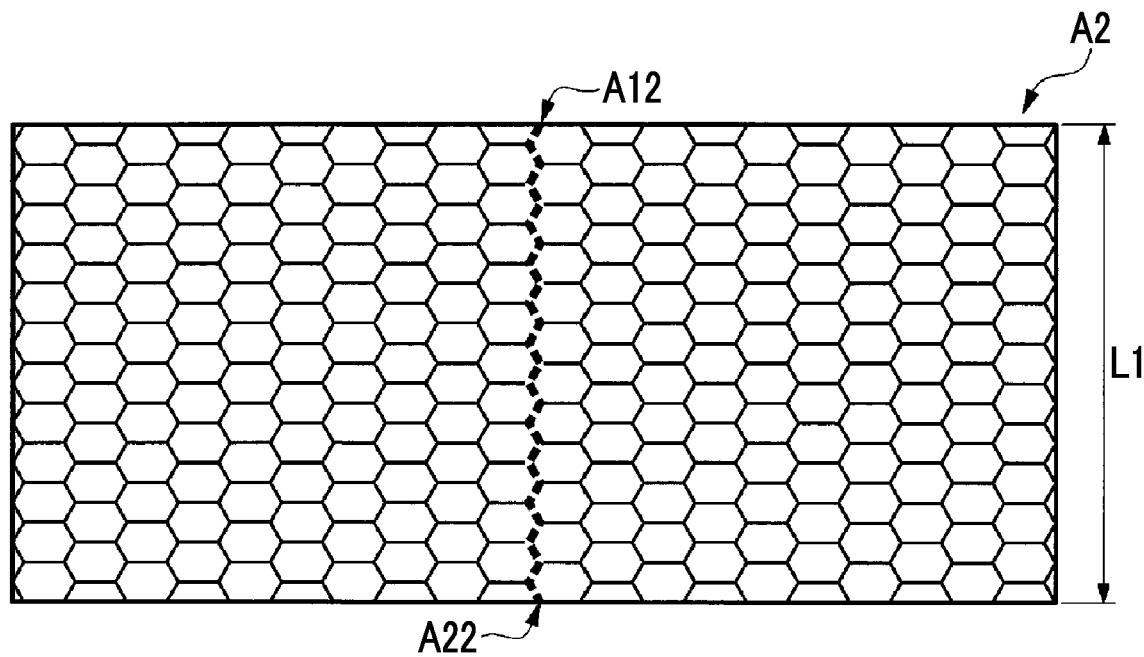
FIG. 6 is a diagram for explaining the electrical characteristics of a composite sintered body in an aspect of the present invention.
Figure 7:
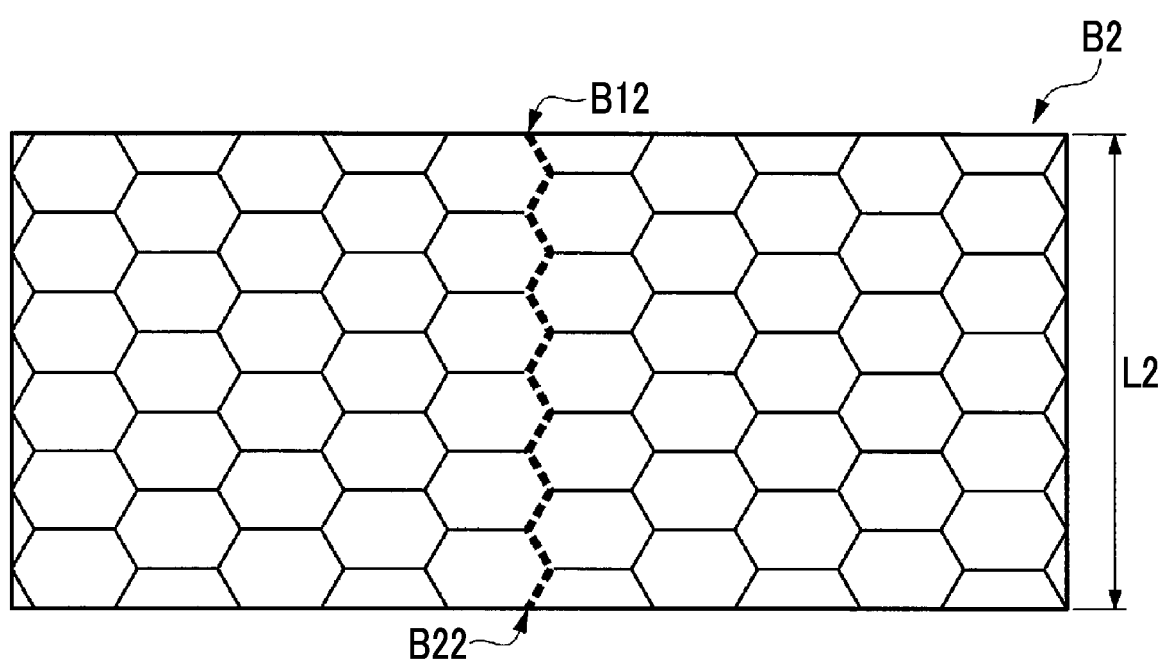
FIG. 7 is a diagram for explaining the electrical characteristics of a composite sintered body in an aspect of the present invention.
Figure 8:
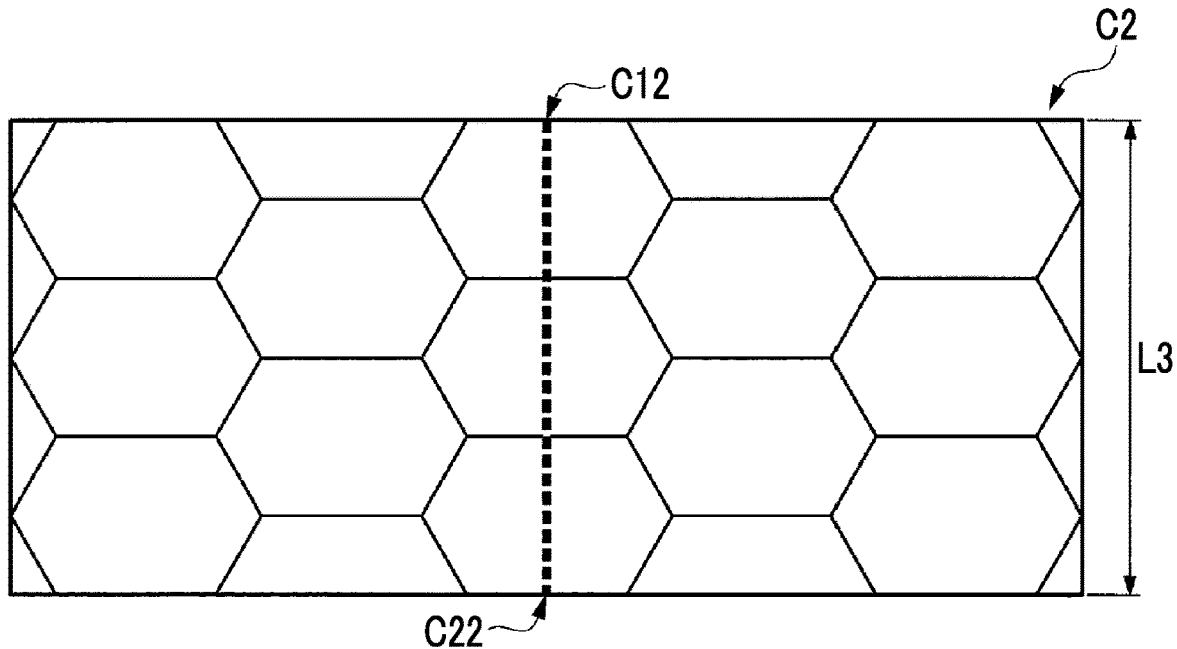
FIG. 8 is a diagram for explaining the electrical characteristics of a composite sintered body in an aspect of the present invention.

FIGS. 6 to 8 are diagrams for explaining the electrical characteristics of the composite sintered body of this embodiment and diagrams schematically showing the crystals of the composite sintered body. FIG. 6 is a diagram for explaining the electrical characteristics of a composite sintered body A2 in which the average crystal grain size of aluminum oxide is less than 0.8 µm. FIG. 7 is a diagram for explaining the electrical characteristics of a composite sintered body B2 in which the average crystal grain size of aluminum oxide is 0.8 µm or more and 1.2 µm or less. FIG. 8 is a diagram for explaining the electrical characteristics of a composite sintered body C2 in which the average crystal grain size of aluminum oxide exceeds 1.2 µm. Further, a length L1 of the composite sintered body A2 shown in FIG. 6, a length L2 of the composite sintered body B2 shown in FIG. 7, and a length L3 of the composite sintered body C2 shown in FIG. 8 are assumed to be the same.

The hexagon in each drawing shows a crystal grain of aluminum oxide which is a main phase. Further, a broken line in each drawing indicates a path in which electrons move at the time of voltage application.

The aluminum oxide which is a main phase, among the materials configuring the composite sintered body of this embodiment, is an insulator, and the silicon carbide which is a sub-phase is an electric conductor. Further, the crystal grains of the silicon carbide are present in the crystal grains of the aluminum oxide and at crystal grain boundaries between the crystal grains of the aluminum oxide. For this reason, if an electric current is tried to flow through the composite sintered body, electrons easily move along the crystal grain boundaries in which the crystal grains of the silicon carbide which is an electric conductor are disposed.

In the composite sintered body A2 of FIG. 6, if voltage is applied to cause an electric current to flow from symbol A12 to symbol A22 (if an attempt to move electrons is made), it is thought that electrons move along crystal grain boundaries. That is, in a case where the average crystal grain size of crystal grains of aluminum oxide is small to be less than 0.8 µm as in the composite sintered body A2, it is thought that the electrons move at the shortest distance connecting symbol A12 and symbol A22 along the crystal grain boundaries between the crystal grains of the aluminum oxide.

Similarly, in the composite sintered body B2 of FIG. 7, if voltage is applied to cause an electric current to flow from symbol B12 to symbol B22, it is thought that electrons move along crystal grain boundaries between crystal grains of aluminum oxide. At this time, in the composite sintered body B2 of FIG. 7, the average crystal grain size of aluminum oxide is larger than that of the composite sintered body A2 of FIG. 6. For this reason, in the composite sintered body B2, the shortest distance connecting symbol B12 and symbol B22 along the crystal grain boundaries becomes longer than that of the composite sintered body A2 having the configuration shown in FIG. 6, and thus the moving distance of the electron becomes longer. As a result, when the same voltage is applied, in the composite sintered body B2 of FIG. 7, the electric current becomes harder to flow than in the composite sintered body A2 of FIG. 6, and thus it is thought that a withstand voltage becomes high.

On the other hand, in the composite sintered body C2 of FIG. 8, in a case where voltage is applied to cause an electric current to flow from symbol C12 to symbol C22, the tendency is different. That is, in the composite sintered body C2, since the average crystal grain size of aluminum oxide is large, the proportion of the number of silicon carbides dispersed in the crystal grains of the aluminum oxide becomes larger than those in the composite sintered bodies A2 and B2. For this reason, the crystal grain of the aluminum oxide of the composite sintered body C2 has lower insulating properties than the crystal grains of the aluminum oxides of the composite sintered bodies A2 and B2.

In the composite sintered body C2, the shortest distance connecting symbol C12 and symbol C22 along the crystal grain boundaries between the crystal grains of the aluminum oxide becomes longer than that in the composite sintered body B2 having the configuration shown in FIG. 7. As a result, in a case where electrons move at the shortest distance connecting symbol C12 and symbol C22 along the crystal grain boundaries between the crystal grains of the aluminum oxide, the moving distance of the electron becomes longer than in the case of the composite sintered body B2. On the other hand, as described above, in the composite sintered body C2, the insulating properties of the crystal grains of the aluminum oxide is lowered. For this reason, if voltage is applied to the composite sintered body C2, the electrons moving within the crystal grains of the aluminum oxide is more energetically advantageous than the electrons moving along the crystal grain boundaries. Therefore, in the composite sintered body C2 of FIG. 8, an electric current more easily flows than in the composite sintered body B2 of FIG. 7, and thus it is thought that a withstand voltage decreases.

As a result of studies by the inventors, it was found that in the composite sintered body which is a ceramic composite sintered body which includes aluminum oxide which is a main phase, and silicon carbide which is a sub-phase, wherein the average crystal grain size of the aluminum oxide is 0.8 μm or more and 1.2 μm or less, crystal grains of the silicon carbide are dispersed in the crystal grains of the aluminum oxide and at crystal grain boundaries between the crystal grains of the aluminum oxide, and the proportion of the number of crystal grains of the silicon carbide dispersed in the crystal grains of the aluminum oxide is 50% or more and 60% or less with respect to the total crystal grains of silicon carbide, the properties as described above are exhibited, and thus both a high relative dielectric constant and a high withstand voltage can be achieved.

In the composite sintered body, the average crystal grain size of the aluminum oxide can be adjusted by controlling a sintering temperature. If the sintering temperature increases, the average crystal grain size of the aluminum oxide tends to become large. If the sintering temperature is lowered, the average crystal grain size of the aluminum oxide tends to become small.

Further, in the composite sintered body, the proportion of the number of crystal grains of the silicon carbide dispersed in the crystal grains of the aluminum oxide can be adjusted by controlling the sintering temperature. If the sintering temperature becomes high, grain growth of the aluminum oxide is promoted. For this reason, if the sintering temperature becomes high, the proportion of the number of crystal grains of the silicon carbide, which are present in the grains, tends to increase. On the other hand, if the sintering temperature is lowered, grain growth of the aluminum oxide is suppressed. For this reason, if the sintering temperature is lowered, the proportion of the number of crystal grains of the silicon carbide, which are present in the grains, tends to decrease.

In the placing plate 11 and the supporting plate 12 of this embodiment, it is preferable that the silicon carbide which is included in the composite sintered body is β-SiC. Further, in the composite sintered body, it is preferable that crystal grains of β-SiC are present to be dispersed in a state of being surrounded by crystal grains of aluminum oxide which is a matrix material. In the composite sintered body, the volume ratio of β-SiC is preferably 4% by volume or more and 15% by volume or less and more preferably 6% by volume or more and 10% by volume or less, with respect to the volume of the entire composite sintered body.

If the volume ratio of β-SiC is smaller than 4% by volume, the expression effect of electron conductivity by the crystal grains of the silicon carbide is small. Further, this is because, if the volume ratio of β-SiC is larger than 15% by volume, there is a concern that the crystal grains of the silicon carbide may come into contact with each other to cause a decrease in resistance value through the crystal grains of the silicon carbide.

Further, in the composite sintered body of this embodiment, the amount of metal impurities other than aluminum and silicon is preferably 100 ppm or less with respect to the total mass of the composite sintered body. The amount of metal impurities is preferably 50 ppm or less and more preferably 25 ppm or less, with respect to the total mass of the composite sintered body.

Elements to be focused on as metal impurities are calcium (Ca), chromium (Cr), iron (Fe), nickel (Ni), copper (Cu), sodium (Na), magnesium (Mg), potassium (K), titanium (Ti), manganese (Mn), zinc (Zn), barium (Ba), and yttrium (Y).

[Method of Manufacturing Composite Sintered Body]

The composite sintered body according to this embodiment can be manufactured by a manufacturing method which includes a step of mixing aluminum oxide particles and silicon carbide particles while causing the aluminum oxide particles and the silicon carbide particles to collide with each other by injecting the aluminum oxide particles and the silicon carbide particles at high speed, a step of removing a dispersion medium from slurry obtained in the mixing step and then forming a formed body, and a step of pressure-sintering the obtained formed body by heating the formed body to a temperature of 1600° C. or higher while compacting the formed body with a pressure of 25 MPa or more under a non-oxidative atmosphere.

In the method of manufacturing the composite sintered body according to this embodiment, it is preferable that in the aluminum oxide particles which are used, the content of aluminum oxide is 99.99% by mass or more with respect to the total mass of all the aluminum oxide particles. Such high-purity aluminum oxide particles can be prepared by using an alum method. In the aluminum oxide particles prepared by using the alum method, the content of sodium atoms which are metal impurities can be significantly reduced compared to aluminum oxide particles prepared by using, for example, a Bayer method. Further, as long as aluminum oxide particles having a desired purity can be obtained, various methods can be adopted.

In this specification, in a case where the aluminum oxide particles are prepared by the alum method, the following operations are performed.

First, colorless and transparent crystals are obtained by dissolving aluminum sulfate and ammonium sulfate in pure water under heating, and then performing stirring and cooling. For further purification, recrystallization is repeated to remove impurities in alum. Thereafter, aluminum oxide is obtained by removing sulfur trioxide by heating to, for example, 1150° C.

In this specification, preparing aluminum oxide particles by the Bayer method means performing the following operations. First, bauxite is washed with, for example, an aqueous solution of sodium hydroxide having a temperature of 250° C. At this time, aluminum oxide which is included in the bauxite becomes aluminum hydroxide and is dissolves in an aqueous solution. Components other than aluminum oxide, which are included in the bauxite, are removed as solid impurities by filtration. Next, aluminum hydroxide is precipitated by cooling the aqueous solution. Thereafter, dehydration occurs from aluminum hydroxide due to heating to, for example, 1050° C., whereby aluminum oxide is obtained.

In the mixing step, aluminum oxide particles dispersed in a dispersion medium and silicon carbide particles dispersed in a dispersion medium are mixed while causing the aluminum oxide particles and the silicon carbide particles to collide with each other by injecting the aluminum oxide particles and the silicon carbide particles at high speed by pressurizing the aluminum oxide particles and the silicon carbide particles, by using a two-stream particle collision type pulverizing and mixing device. In this way, the aluminum oxide particles and the silicon carbide particles are pulverized, and thus a dispersion liquid containing these pulverized particles is obtained.

When causing the aluminum oxide particles and the silicon carbide particles to collide with each other, large particles have large kinetic energy at the time of collision and are easily pulverized. On the other hand, small particles have small kinetic energy at the time of collision and are not easily pulverized. For this reason, the aluminum oxide particles and the silicon carbide particles which are obtained by using the above-mentioned pulverizing and mixing device become particles with few coarse particles or excessively pulverized particles and having a narrow particle size distribution width. Therefore, if the mixed particles pulverized and mixed by using the two-stream particle collision type pulverizing and mixing device are used, abnormal grain growth with coarse particles as nuclei can be suppressed in the sintering step.

For example, if the pulverizing and mixing are performed by using media such as a ball mill or a bead mill, there is a concern that mixing-in of impurities due to damage to each medium may occur. Compared to this, by the pulverizing and mixing using the pulverizing and mixing device as in this embodiment, it is possible to suppress mixing-in of impurities.

In the step of forming a formed body, first, the dispersion liquid obtained by the pulverizing and mixing device is spray-dried to obtain granules composed of mixed particles of the aluminum oxide particles and the silicon carbide particles.

Subsequently, the obtained granules are uniaxially formed (formed with uniaxial press) according to the shape of an aimed sintered body.

Subsequently, the obtained formed body is heated to, for example, 500° C. at normal pressure (without applying a press pressure) under an inert gas atmosphere, whereby contaminants such as moisture or the dispersion medium, which are included in the formed body, are removed. As inert gas, nitrogen or argon can be used. In this operation, as long as the contaminants can be removed from the formed body without modifying the formed body, the heating temperature is not limited to 500° C.

Further, it is preferable to include an oxidation step of performing oxidation treatment on the mixed particles configuring the formed body by heating the formed body from which the contaminants have been removed, to a temperature of, for example, 400° C. in the atmosphere. Due to this oxidation treatment, oxide films are formed on the surfaces of the silicon carbide particles which are included in the mixed particles. Metal impurities which are included in the mixed particles easily elutes to the oxide film, and therefore, the metal impurities which are included in the mixed particles are present to be biased to the surfaces of the particles. Then, in the pressure-sintering step which will be described later, the metal impurities can be easily removed, which is preferable.

In the pressure-sintering step, first, the formed body described above is heated (preliminarily heated) to a temperature lower than 1600° C. and at normal pressure (without applying a press pressure) in a vacuum atmosphere (a first non-oxidative atmosphere). According to this operation, by appropriately setting the temperature at the time of the preliminary heating, metal impurities such as alkali metal, which are included in the mixed particles, evaporate, and thus the metal impurities can be easily removed. For this reason, according to such an operation, the purity of the mixed particles is easily improved. Further, the volume resistivity value of the base is easily controlled.

Further, if in the step of forming a formed body, the oxidation treatment is performed on the formed body from which contaminants have been removed as described above, the oxide film formed on the particle surface is volatilized by performing the preliminary heating under a vacuum atmosphere. At the same time, the metal impurities included in the oxide film evaporate. For this reason, the metal impurities can be easily removed from the formed body. Therefore, according to such an operation, the purity of the mixed particles is easily improved. Further, the volume resistivity value of the base is easily controlled.

In this embodiment, the term "vacuum" refers to a "state in a space filled with a base gas and having a pressure lower than the atmospheric pressure" and a state defined as an industrially usable pressure in the JIS standard. In this embodiment, the vacuum atmosphere may be low vacuum (100 Pa or higher). However, medium vacuum (in a range of 0.1 Pa to 100 Pa) is preferable, and high vacuum (in a range of $10^{-5}$ Pa to 0.1 Pa) is more preferable.

In the method of manufacturing a composite sintered body of this embodiment, for example, after the preliminary heating is performed at 1200° C. for 4 hours or more under a vacuum atmosphere, air pressure is returned to the atmospheric pressure with argon.

Subsequently, the formed body subjected to the preliminary heating is pressure-sintered by heating the formed body to a temperature of 1600° C. or higher while compacting it with a pressure of 5 MPa or more in an argon atmosphere (a second non-oxidative atmosphere). According to such an operation, sintering of the aluminum oxide particles or the silicon carbide particles which are included in the formed body progresses, and thus a dense sintered body having few pores is obtained.

In the method of manufacturing a composite sintered body of this embodiment, sintering is performed under, for example, an argon atmosphere, at a temperature of 1600° C. or more and 1850° C. or less and a sintering pressure of 25 MPa or more and 50 MPa or less.

In the sintered body obtained by being manufactured by such a method, the amount of metal impurity is reduced, and thus the sintered body having high purity is obtained. In a case where the amount of metal impurities does not reach the target value, it is favorable if the preliminary heating time is lengthened or the preliminary heating temperature is increased.

By the above, it is possible to manufacture the composite sintered body of this embodiment.

By grinding the obtained composite sintered body into a desired shape, it is possible to form each of the placing plate 11 and the supporting plate 12, which is the base configuring the electrostatic chuck member. The projection portions 11b formed on the placing surface 11a of the placing plate 11 can be suitably formed by a known method.

According to the composite sintered body having the configuration as described above, it is possible to provide a composite sintered body for an electrostatic chuck, which is suitably used in an electrostatic chuck device and can improve productivity.

Further, according to the electrostatic chuck device having the configuration as described above, it is possible to provide an electrostatic chuck device in which productivity can be improved.

The preferred embodiments of the present invention have been described above with reference to the accompanying drawings. However, it goes without saying that the present invention is not limited to such examples. The shapes, combinations, or the like of the respective constituent members shown in the examples described above are merely examples, and various changes can be made based on design requirements or the like within a scope which does not depart from the gist of the present invention.

For example, in this specification, the composite sintered body of the first embodiment and the composite sintered body of the second embodiment have been described separately. However, the composite sintered body may be provided with both the aspect described in the first embodiment and the aspect described in the second embodiment.

EXAMPLE

Hereinafter, the present invention will be described with examples. However, the present invention is not limited to these examples.

Example 1A

In this example, the volume resistivity value of a disk-shaped sintered body was measured by a direct-current three-terminal method.

(Used Equipment)

Screen printer: MODEL MEC-2400 type manufactured by Mitani Micronics Co., Ltd.

Resistivity measuring device: manufactured by NISHIYAMA-SEISAKUSHO Co., Ltd.

Insulation meter: digital insulation meter (Model DSM-8103, HIOKI E.E. Corporation)

(Measurement Conditions)

Temperature: room temperature (24° C.), 50° C., 100° C., 150° C., 200° C., 250° C., 300° C.

Atmosphere: nitrogen (purity: 99.99995%, flow rate: 200 ml/min.)

Applied voltage: 0.5 kV, 1 kV (Measuring Method)

Figure 2:
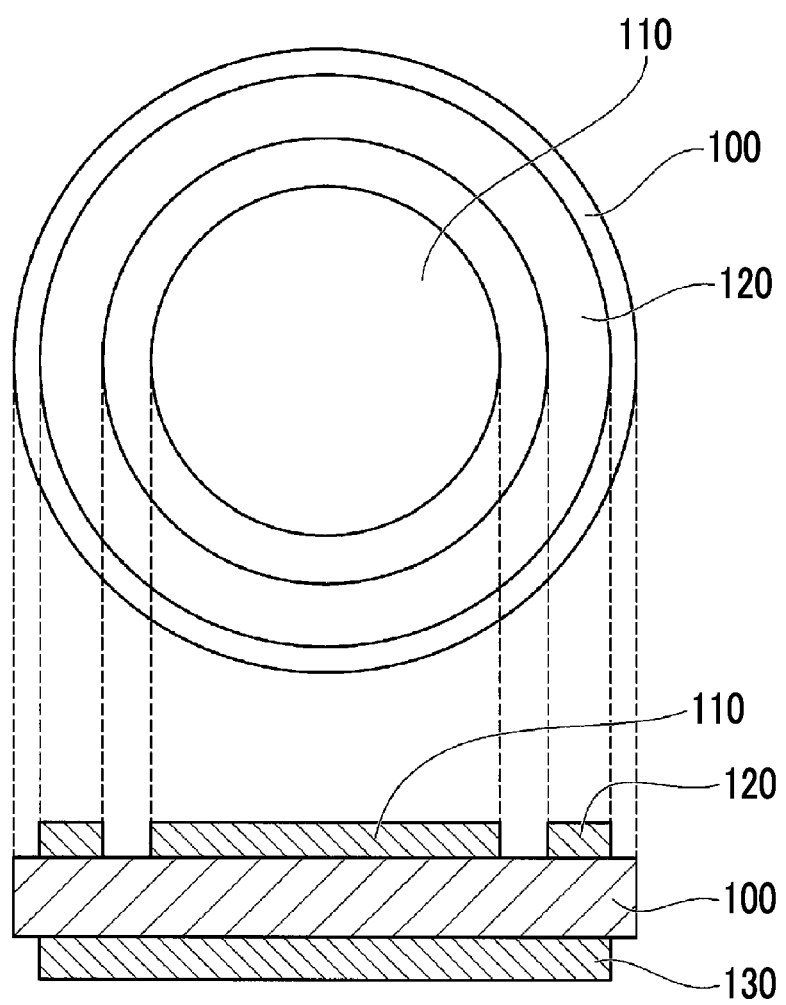
FIG. 2 is a schematic diagram showing a state of a sintered body when measuring a volume resistivity value in Example 1A.

Silver paste (NP-4635 manufactured by Noritake Co., Ltd.) was printed on the upper and lower surfaces of the sintered body by using a screen printer, and dried at 100° C. for 12 hours in the atmosphere. Thereafter, the silver paste was baked at 450° C. for 1 hour in the atmosphere to form a main electrode, a guard electrode, and a counter electrode. FIG. 2 is a schematic diagram showing the state of the sintered body when measuring the volume resistivity value in this example. In FIG. 2, reference numeral 100 denotes the sintered body, reference numeral 110 denotes the main electrode, reference numeral 120 denotes the guard electrode, and reference numeral 130 denotes the counter electrode.

At this time, the diameter of the main electrode was 1.47 cm, and the inner diameter of the guard electrode was 1.60 cm.

A direct-current voltage was applied to the sintered body with each electrode formed thereon as described above, at each measurement temperature, and an electric current after charging for 1 minute was measured to obtain the volume resistance of the sintered body. Thereafter, a volume resistivity ($\rho v$) was calculated from the following expression (1) by using the thickness of the sintered body and the area of the electrode.

$$\rho v = S/t \times Rv = S/t \times V/I \qquad (1)$$

(S: effective area (cm$^2$) of an electrode, t: thickness (cm) of a sintered body, Rv: volume resistance, V: direct-current voltage (V), I: electric current (A))

(Dielectric Loss Tangent)

In this example, a dielectric loss tangent was measured by a parallel plate method using a precision impedance analyzer (model number: 4294A, manufactured by Agilent Technologies) and a dielectric test fixture (model number: 16451B, manufactured by Agilent Technologies).

(Structure Observation of Composite Sintered Body)

The structure of the composite sintered body was observed by using a test piece obtained by cutting out a part of the composite sintered body obtained after the pressure-sintering and using a scanning electron microscope.

(Measurement Conditions)

Device name: model number: S-4000, manufactured by Hitachi High-Technologies Corporation Sample fabrication: thermal etching (1400° C., 30 min, Ar atmosphere)

(Interface Observation of Composite Sintered Body)

The structure of the composite sintered body was observed by using a test piece obtained by cutting out a part of the composite sintered body obtained after the pressure-sintering and using a transmission electron microscope.

(Measurement Conditions)

Device name: atomic resolution analysis electron microscope JEM-ARM200F Dual-X manufactured by JEOL EDX detector: JED-2300, manufactured by JEOL Observation conditions: acceleration voltage 200 kV, beam diameter: about 0.2 nmφ

Sample fabrication: mechanical polishing and ion milling (PIPS 691 manufactured by Gatan, acceleration voltage ~4 kV)

(Fabrication of Composite Sintered Body)

As a starting material, β-SiC type silicon carbide (β-SiC) particles having an average particle diameter of 0.03 μm and synthesized by thermal plasma CVD, and aluminum oxide ($Al_2O_3$) particles having an average particle diameter of 0.1 μm and the amount of metal impurity of 95 ppm with respect to the total mass of the aluminum oxide ($Al_2O_3$) particles were used.

Weighing was performed such that the β-SiC particles are 8% by mass with respect to the total mass of the β-SiC particles and the $Al_2O_3$ particles, and the β-SiC particles and the $Al_2O_3$ particles were put in distilled water containing a dispersant. The dispersion liquid with the β-SiC particles and the $Al_2O_3$ particles put therein was subjected to dispersion treatment by an ultrasonic dispersing device, and then pulverized and mixed by using a two-stream particle collision type pulverizing and mixing device.

The obtained mixed solution was spray-dried with a spray dryer to obtain mixed particles of β-SiC and $Al_2O_3$.

The mixed particles were subjected to uniaxial press forming at a press pressure of 8 MPa to obtain a formed body having a diameter of 320 mm and a thickness of 15 mm.

Subsequently, the formed body was heated to 500° C. under a nitrogen atmosphere without applying a press pressure thereto to remove moisture and the dispersant (contaminants).

Thereafter, the formed body with the contaminants removed therefrom was heated to 400° C. in the atmosphere to oxidize the surfaces of the β-SiC particles which are included in the formed body.

The obtained formed body was set in a graphite mold and pressure-sintering was performed. First, the formed body was heated to 1200° C. under a vacuum atmosphere without applying a press pressure thereto. Thereafter, sintering was performed at a press pressure of 40 MPa and a temperature of 1800° C. under an argon atmosphere to obtain a composite sintered body of Example 1A.

The amount of metal impurities of the composite sintered body of Example 1A was 80 ppm with respect to the total mass of the composite sintered body. In this example, as the amount of metal impurities, the value measured by an ICP-MS method was adopted.

Comparative Example 1A

As $Al_2O_3$ particles, $Al_2O_3$ particles having the amount of metal impurities of 800 ppm with respect to the total mass of $Al_2O_3$ particles and metal impurities, and an average particle diameter of 0.5 μm, were used. Further, a sintered body of Comparative Example 1A was obtained in the same manner as in Example 1A except that heat treatment (sintering) was performed on the formed body with the contaminants removed therefrom under an argon atmosphere without exposing the formed body to a vacuum atmosphere from room temperature to a sintering temperature.

The amount of metal impurities of the sintered body of Comparative Example 1A was 795 ppm with respect to the total mass of the composite sintered body. As the amount of metal impurities, similar to Example 1A, the value measured by an ICP-MS method was adopted.

Reference Example 1A

A sintered body of Reference Example 1A was obtained in the same manner as Example 1A except that β-SiC particles which are starting materials were not used.

Figure 3:
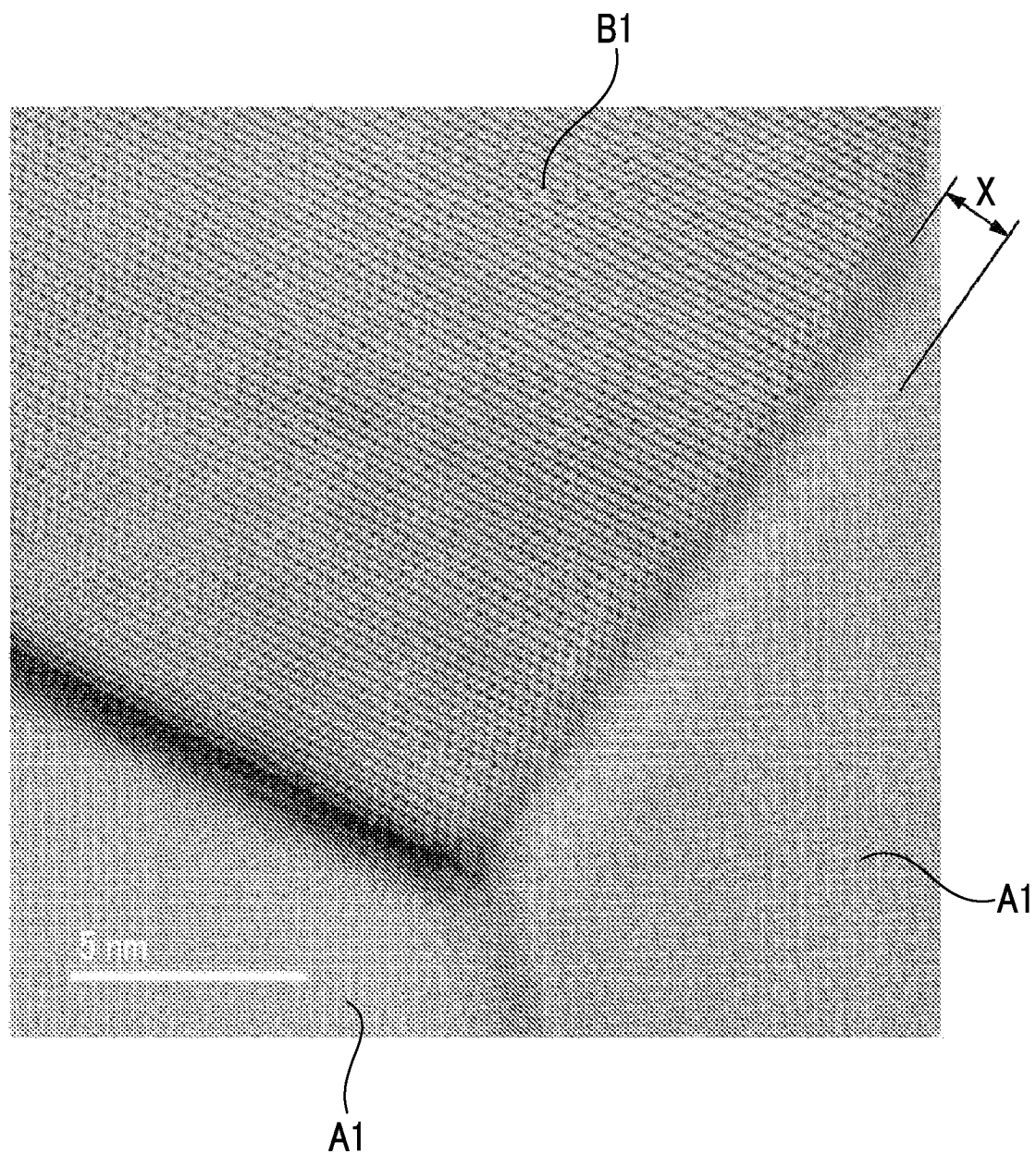
FIG. 3 is an electron micrograph of a composite sintered body of Example 1A.
Figure 4:
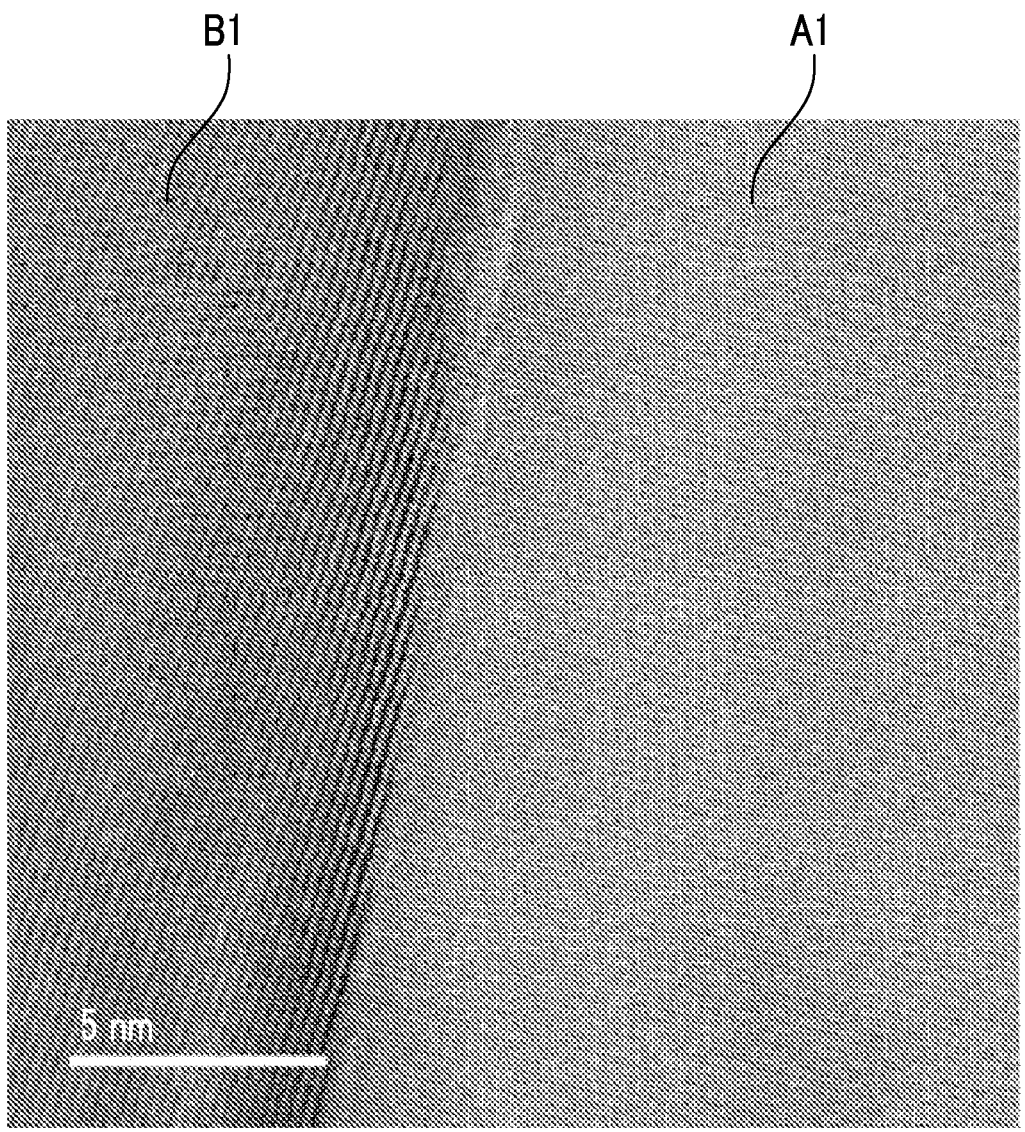
FIG. 4 is an electron micrograph of a composite sintered body of Comparative Example 1A.

FIGS. 3 and 4 are electron micrographs of the fabricated composite sintered bodies. FIG. 3 shows the composite sintered body of Example 1A, and FIG. 4 shows the composite sintered body of Comparative Example 1A. In each photograph, a crystal indicated by symbol A1 represents aluminum oxide, and a crystal indicated by symbol B1 represents silicon carbide.

As shown in FIG. 3, in the composite sintered body of Example 1A, a region of about 1 nm, which is different from the crystal of the aluminum oxide and the crystal of the silicon carbide, was observed at the grain boundary between the crystal of the aluminum oxide and the crystal of the silicon carbide. That is, an interface layer X of about 1 nm could be confirmed at the grain boundary between the crystal of the aluminum oxide and the crystal of the silicon carbide.

On the other hand, as shown in FIG. 4, in the composite sintered body of Comparative Example 1A, an interface layer could not be confirmed at the grain boundary between the crystal of the aluminum oxide and the crystal of the silicon carbide.

Figure 5:
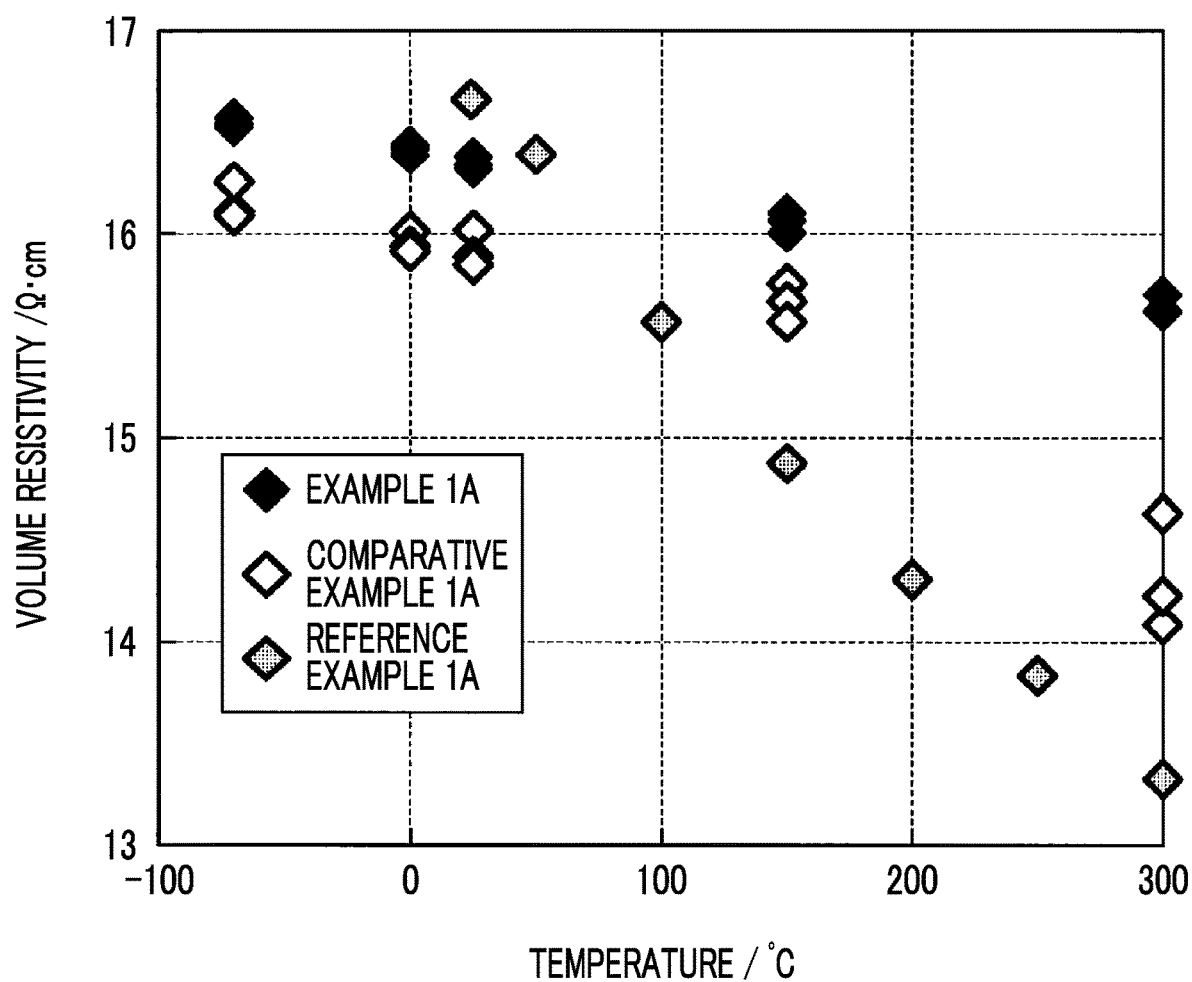
FIG. 5 is a graph showing the results of a confirmation of the temperature dependency with respect to the volume resistivity of each of the sintered bodies manufactured in Example 1A, Comparative Example 1A, and Reference Example 1A.

FIG. 5 is a semi-logarithmic graph showing the results of confirming the temperature dependency of the volume resistivity of each of the fabricated sintered bodies. In FIG. 5, the horizontal axis represents a measurement temperature (unit: ° C.) and the vertical axis represents a volume resistivity (unit: Ω·cm).

As shown in FIG. 5, in the composite sintered body of Example 1A, it could be confirmed that the volume resistivity is $5 \times 10^{15}$ Ω·cm or more in a wide range from −70° C. to 300° C. On the other hand, in the composite sintered body of Comparative Example 1A, the volume resistivity was lower than $1 \times 10^{15}$ Ω·cm at 300° C. In the composite sintered body of Reference Example 1A, the volume resistivity showed a tendency to decrease according to a temperature rise, and the volume resistivity was lower than $1 \times 10^{15}$ Ω·cm at 150° C.

Table 1 shows the results of measuring the dielectric loss tangent at the temperatures at which the volume resistivity was measured in FIG. 5, with respect to the composite sintered bodies of Example 1A and Comparative Example 1A. The measurement of the dielectric loss tangent was performed at 100 kHz, 500 kHz, and 1 MHz.

TABLE 1

| | Example 1 | | | Comparative Example 1 | | |
|---|---|---|---|---|---|---|
| | 100 kHz | 500 kHz | 1 MHz | 100 kHz | 500 kHz | 1 MHz |
| −70° C. | 0.0025 | 0.0025 | 0.0028 | 0.0021 | 0.0033 | 0.0045 |
| 0° C. | 0.0025 | 0.0021 | 0.002 | 0.0027 | 0.0031 | 0.0036 |
| 25° C. | 0.0022 | 0.0017 | 0.0016 | 0.0033 | 0.0033 | 0.0033 |
| 150° C. | 0.0072 | 0.0042 | 0.0039 | 0.0107 | 0.0073 | 0.0066 |
| 300° C. | 0.0463 | 0.0291 | 0.0226 | 0.0573 | 0.0372 | 0.0291 |

As a result of the measurement, it could be confirmed that the dielectric loss tangent of the composite sintered body of Example 1A is lower than that of the composite sintered body of Comparative Example 1A.

Example 1B (Relative Dielectric Constant, Dielectric Loss Tangent)

The relative dielectric constant and the dielectric loss tangent were measured by the parallel plate method using the precision impedance analyzer (model number: 4294A, manufactured by Agilent Technologies) and the dielectric test fixture (model number: 16451B, manufactured by Agilent Technologies), similar to Example 1A.

(Withstand Voltage)

In this example, a voltage (withstand voltage) at which an electric current of 1 μA flows through a test piece when voltage is applied at a rate of temperature rise of 1 kV/sec in silicone oil at room temperature after the composite sintered body is sandwiched between cylindrical electrodes each having a diameter of 20 mm was measured by using a high-voltage power supply (model HGR10-20P, manufactured by Matsuda Precision Co., Ltd.).

(Proportion of the Number of Crystal Grains of Silicon Carbide dispersed in Crystal Grains of Aluminum Oxide)

In this example, the surface of a composite oxide (a composite sintered body) was mirror-polished with a diamond paste of 3 μm, and then thermal etching was performed at 1400° C. for 30 minutes under an argon atmosphere.

The surface of the obtained sintered body was subjected to structure observation at a magnification of 10000 by using a scanning electron microscope (model number: S-4000, manufactured by Hitachi High-Technologies Corporation).

The proportion of the crystal grains of the silicon carbide dispersed in the crystal grains of the aluminum oxide was determined with 150 crystal grains of the silicon carbide randomly extracted in the obtained electron micrograph regarded as the "total crystal grains of the silicon carbide". The same processing was carried out in electron micrographs of two visual fields, and the average value was determined as the "percentage of the number of crystal grains of the silicon carbide dispersed in the crystal grains of the aluminum oxide".

(Level 1)

A composite sintered body of Level 1 was obtained by the same process as that in the composite sintered body of Example 1A.

The amount of metal impurities of the composite sintered body of Level 1 was 80 ppm. In Level 1, as the amount of metal impurities, the value measured by the ICP-MS method was adopted.

Figure 9:
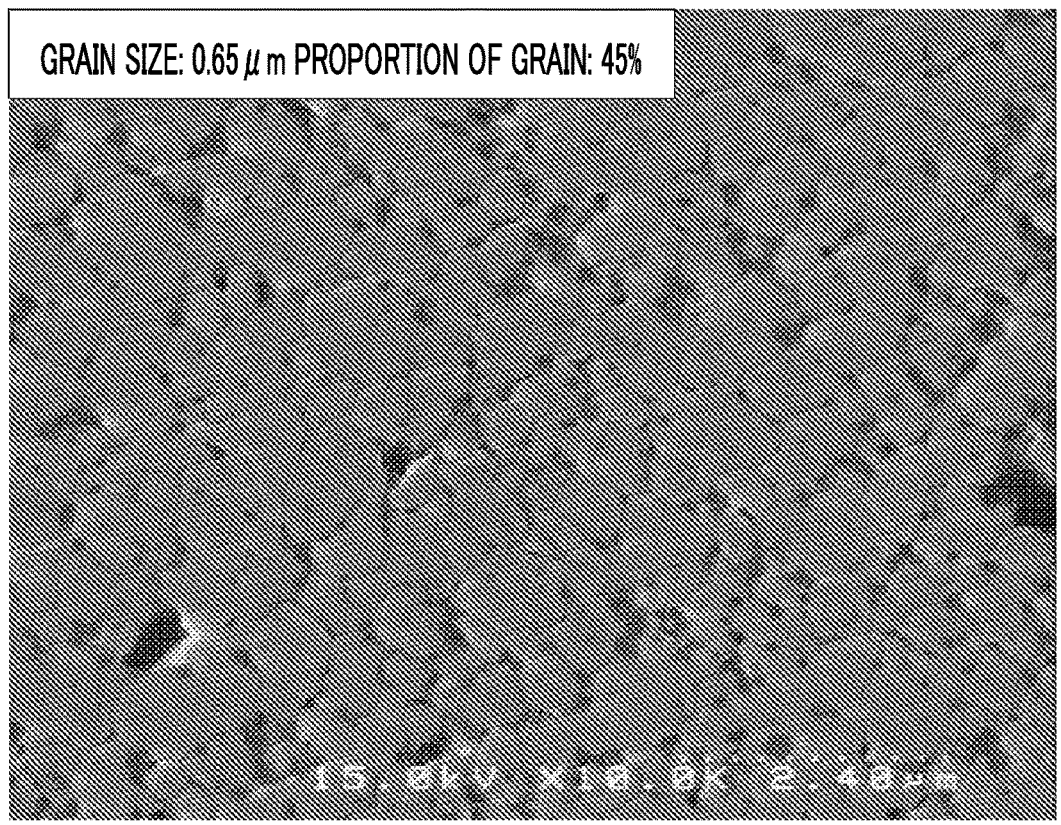
FIG. 9 is an electron micrograph of a composite sintered body of Level 1.

Further, an electron micrograph of the composite sintered body of Level 1 was taken under the conditions described above. FIG. 9 is the taken electron micrograph. The portions that appear relatively black are the crystal grains of the silicon carbide, and the portions that appear white are the crystal grains of the aluminum oxide.

When the average crystal grain size of the aluminum oxide was determined from the obtained electron micrograph, the average crystal grain size was 0.65 μm. Further, when the proportion of the number of crystal grains of the silicon carbide dispersed in the crystal grains of the aluminum oxide was determined, the proportion was 45%.

(Level 2)

A composite sintered body of Level 2 was obtained in the same manner as that in Level 1 except that sintering was performed at a press pressure of 40 MPa and a temperature of 1845° C. under an argon atmosphere.

Figure 10:
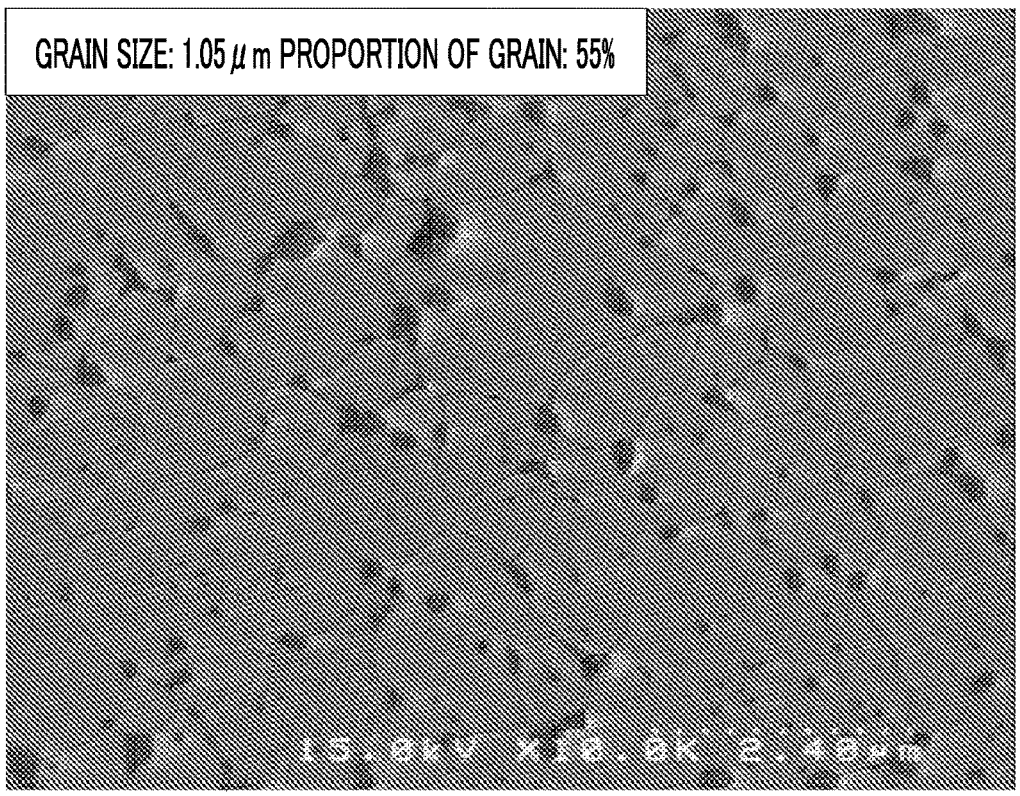
FIG. 10 is an electron micrograph of a composite sintered body of Level 2.

Further, an electron micrograph of the composite sintered body of Level 2 was taken under the conditions described above. FIG. 10 is the taken electron micrograph. When the average crystal grain size of the aluminum oxide was determined from the obtained electron micrograph, the average crystal grain size was 1.05 μm. Further, when the proportion of the number of crystal grains of the silicon carbide dispersed in the crystal grains of the aluminum oxide was determined, the proportion was 55%.

(Level 3)

A composite sintered body of Level 3 was obtained in the same manner as that in Level 1 except that sintering was performed at a press pressure of 40 MPa and a temperature of 1875° C. under an argon atmosphere.

Figure 11:
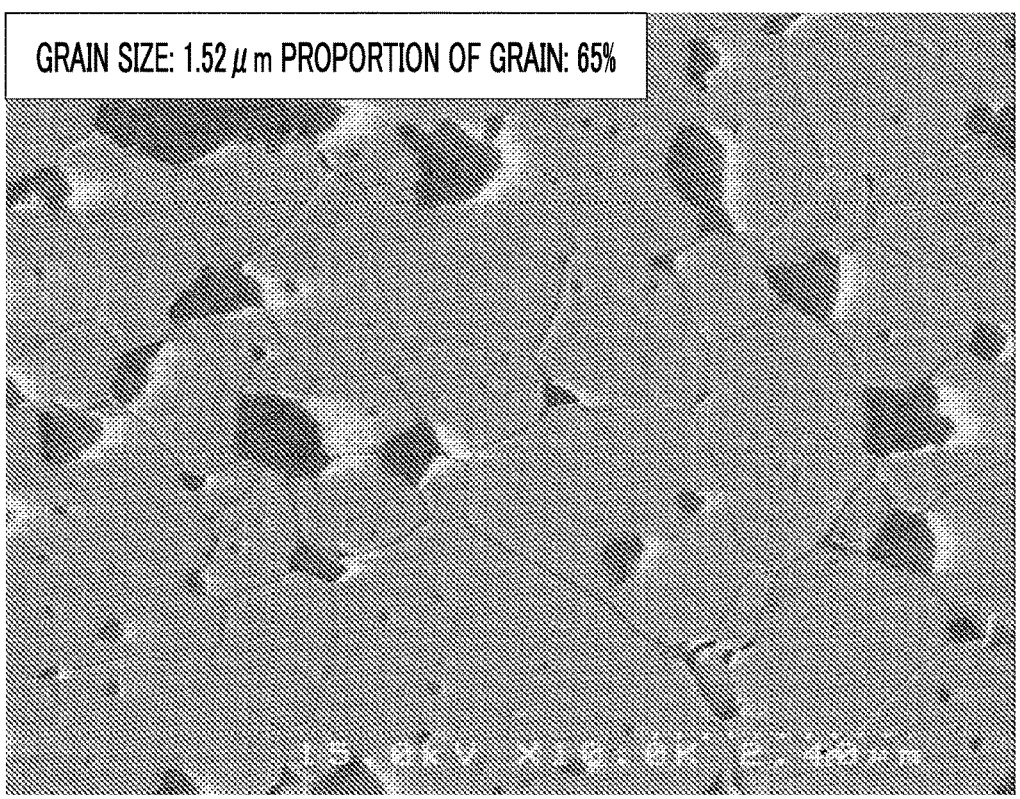
FIG. 11 is an electron micrograph of a composite sintered body of Level 3.

Further, an electron micrograph of the composite sintered body of Level 3 was taken under the conditions described above. FIG. 11 is the taken electron micrograph. When the average crystal grain size of the aluminum oxide was determined from the obtained electron micrograph, the average crystal grain size was 1.52 μm. Further, when the proportion of the number of crystal grains of the silicon carbide dispersed in the crystal grains of the aluminum oxide was determined, the proportion was 65%.

(Level 4)

A composite sintered body of Level 4 was obtained in the same manner as that in Level 1 except that sintering was performed at a press pressure of 40 MPa and a temperature of 1750° C. under an argon atmosphere.

Further, an electron micrograph of the composite sintered body of Level 4 was taken under the conditions described above. When the average crystal grain size of the aluminum oxide was determined from the obtained electron micrograph, the average crystal grain size was 0.56 μm. Further, when the proportion of the number of crystal grains of the silicon carbide dispersed in the crystal grains of the aluminum oxide was determined, the proportion was 39%.

Figure 12:
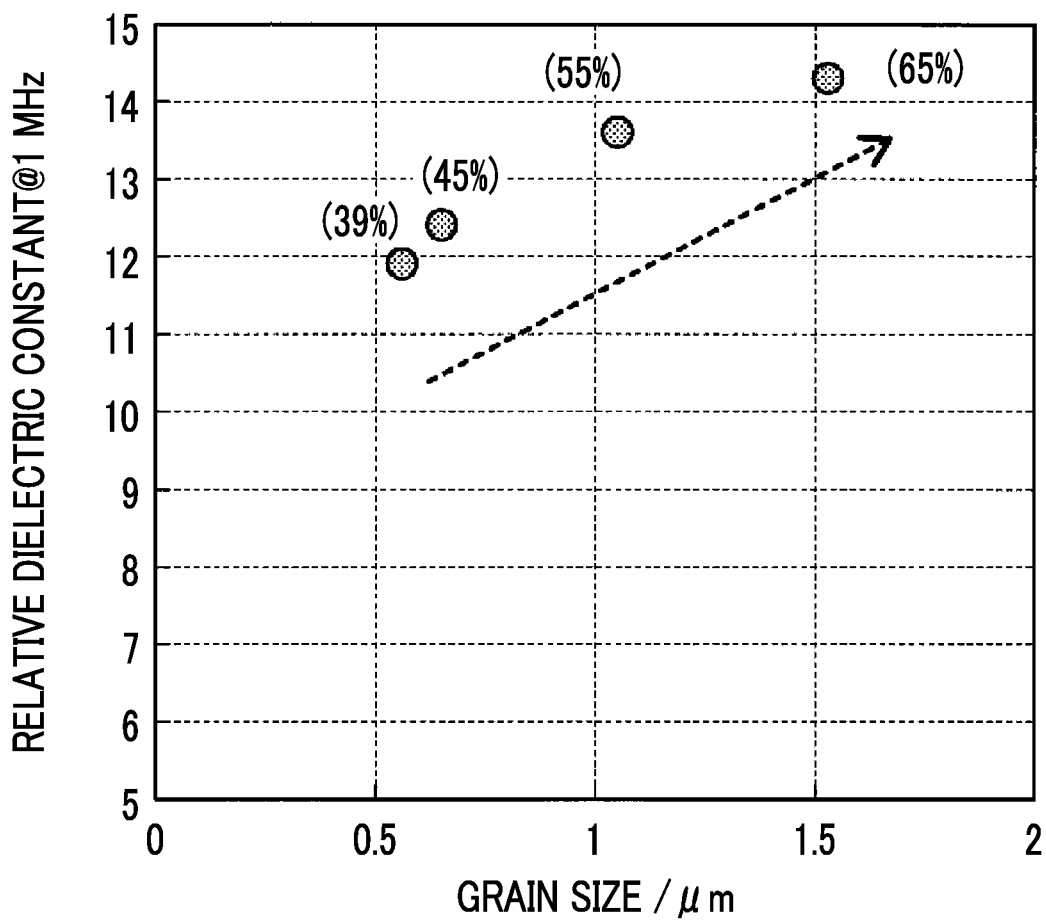
FIG. 12 is a graph showing the relationship between the average crystal grain size of aluminum oxide and the relative dielectric constant of a composite sintered body, with respect to a composite sintered body of Example 1B.

FIG. 12 is a graph showing the relationship between the relative dielectric constant of the composite sintered body and the average crystal grain size of the aluminum oxide, with respect to the composite sintered body of this example. In FIG. 12, the horizontal axis represents an average crystal grain size (unit: μm) of aluminum oxide, and the vertical axis represents a relative dielectric constant (unit: non-dimension) at the time of application of an alternating-current voltage of 1 MHz. Further, in FIG. 12, the proportion of the number of crystal grains of the silicon carbide dispersed in the crystal grains of the aluminum oxide is also shown together.

As shown in FIG. 12, it can be seen that, in the composite sintered body of this example, the relative dielectric constant tends to increase according to an increase in the average crystal grain size of the aluminum oxide.

Figure 13:
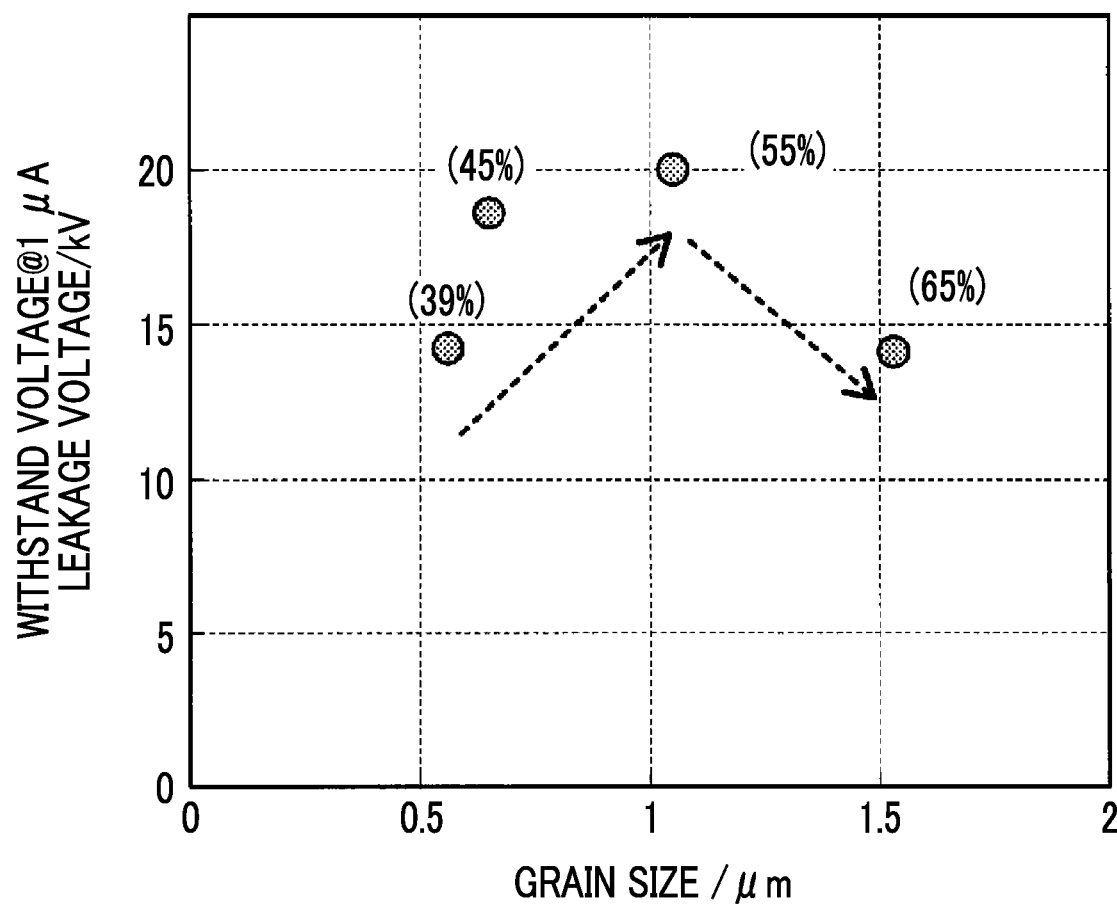
FIG. 13 is a graph showing the relationship between the average crystal grain size of aluminum oxide and a withstand voltage, with respect to the composite sintered body of Example 1B.

FIG. 13 is a graph showing the relationship between the withstand voltage and the average crystal grain size of the aluminum oxide, with respect to the composite sintered body of this example. In FIG. 13, the horizontal axis represents an average crystal grain size (unit: μm) of aluminum oxide, and the vertical axis represents a voltage (unit: kV) at which an electric current of 1 μA flows in a test piece under the measurement conditions described above. Further, in FIG. 13, the proportion of the number of crystal grains of the silicon carbide dispersed in the crystal grains of the aluminum oxide is also shown together.

As shown in FIG. 13, it can be seen that, in the composite sintered body of this example, the withstand voltage increases according to an increase in the average crystal grain size of the aluminum oxide, and after the withstand voltage shows the maximum near the average crystal grain size of 1 μm, the withstand voltage tends to decrease according to an increase in the average crystal grain size of the aluminum oxide.

As described above, in the electrostatic chuck device, (i) in order to reduce an in-plane temperature distribution (temperature difference) of a wafer, a technique for cooling the wafer placed on a sample stage by providing minute grooves in the sample stage and making a gas refrigerant (for example, helium) flow in the grooves is known. In order to enhance temperature uniformity in such an electrostatic chuck device, it is conceivable to increase a gas pressure of the refrigerant to improve cooling efficiency. On the other hand, in a case of increase the gas pressure of the refrigerant, the electrostatic chuck device is required to have a high adsorption force such that the wafer is not detached due to the pressure received from the refrigerant. In order to obtain a high adsorption force, it is preferable that the relative dielectric constant of the base of the electrostatic chuck device is 13 or more.

Further, in a semiconductor manufacturing apparatus using the electrostatic chuck device, (ii) in order to reliably carry out a deep drilling processing technique, an applied voltage at the time of the processing tends to increase. For this reason, a high withstand voltage is required for the electrostatic chuck device. In order to prevent damage to the base of the electrostatic chuck device under the processing conditions at the time of the deep drilling processing, it is preferable that the withstand voltage of the base is 16 kV or more.

From the results of this embodiment, it is found that, in the composite sintered body in which the average crystal grain size of the aluminum oxide is 0.8 μm or more and 1.2 μm or less and the proportion of the number of crystal grains of the silicon carbide dispersed in the crystal grains of the aluminum oxide is 50% or more and 60% or less with respect to the total crystal grains of the silicon carbide, both the high relative dielectric constant and the high withstand voltage are achieved.

From the above results, it is found that the present invention is useful.

INDUSTRIAL APPLICABILITY

The present invention can provide a composite sintered body for an electrostatic chuck, which can be suitably used in an electrostatic chuck device and can improve productivity. Further, it is possible to provide a composite sintered body for an electrostatic chuck, which has both the high relative dielectric constant and the high withstand voltage. Further, it is possible to provide an electrostatic chuck member and an electrostatic chuck device using such a composite sintered body for an electrostatic chuck.

REFERENCE SIGNS LIST

1: electrostatic chuck device
11: placing plate (base)
11a: placing surface
12: supporting plate (base)
13: electrostatic attraction electrode
W: plate-shaped sample
A1: aluminum oxide
B1: silicon carbide
X: interface layer

The invention claimed is:

1. A composite sintered body which is a ceramic composite sintered body, the composite sintered body comprising:
aluminum oxide which is a main phase;
silicon carbide which is a sub-phase;
at least one crystal grain of the silicon carbide, which is located between at least two crystal grains of the aluminum oxide; and
an interface layer which includes, as a forming material, a material other than the aluminum oxide and the silicon carbide, at a grain boundary between the crystal grain of the aluminum oxide and the crystal grain of the silicon carbide.

2. The composite sintered body according to claim 1, wherein a thickness of the interface layer is 0.6 nm or more and 2.5 nm or less.

3. The composite sintered body according to claim 2, wherein a volume resistivity value is $5\times10^{15}$ Ω·cm or more in an entire range from room temperature to 300° C.

4. The composite sintered body according to claim 2, wherein an average crystal grain size of the aluminum oxide is 0.8 μm or more and 1.2 μm or less,
the crystal grains of the silicon carbide are dispersed in the crystal grains of the aluminum oxide and at grain boundaries between the crystal grains of the aluminum oxide, and
the proportion of the number of crystal grains of the silicon carbide dispersed in the crystal grains of the aluminum oxide is 50% or more and 60% or less with respect to the total number of crystal grains of the silicon carbide.

5. The composite sintered body according to claim 4, wherein an average crystal grain size of the crystal grains of the silicon carbide dispersed in the crystal grains of the aluminum oxide is smaller than an average crystal grain size of the crystal grains of the silicon carbide dispersed at the crystal grain boundaries of the aluminum oxide.

6. An electrostatic chuck member comprising:
a base which includes, as a forming material, the composite sintered body according to claim 2, the base having one principal surface which is a placing surface on which a plate-shaped sample is placed; and
an electrostatic attraction electrode provided on a principal surface of the base on a side opposite to the one principal surface of the base, or in an interior of the base.

7. An electrostatic chuck device comprising:
the electrostatic chuck member according to claim 6; and
cooling means for cooling the plate-shaped sample placed on the placing surface,
wherein a plurality of projection portions supporting the plate-shaped sample are provided on the placing surface, and
the cooling means supplies heat transfer gas between the plurality of projection portions.

8. The composite sintered body according to claim 1, wherein a volume resistivity value is $5\times10^{15}$ Ω·cm or more in an entire range from room temperature to 300° C.

9. The composite sintered body according to claim 8, wherein an average crystal grain size of the aluminum oxide is 0.8 μm or more and 1.2 μm or less,
the crystal grains of the silicon carbide are dispersed in the crystal grains of the aluminum oxide and at grain boundaries between the crystal grains of the aluminum oxide, and
the proportion of the number of crystal grains of the silicon carbide dispersed in the crystal grains of the aluminum oxide is 50% or more and 60% or less with respect to the total number of crystal grains of the silicon carbide.

10. The composite sintered body according to claim 9, wherein an average crystal grain size of the crystal grains of the silicon carbide dispersed in the crystal grains of the aluminum oxide is smaller than an average crystal grain size of the crystal grains of the silicon carbide dispersed at the crystal grain boundaries of the aluminum oxide.

11. An electrostatic chuck member comprising:
a base which includes, as a forming material, the composite sintered body according to claim 8, the base having one principal surface which is a placing surface on which a plate-shaped sample is placed; and
an electrostatic attraction electrode provided on a principal surface of the base on a side opposite to the one principal surface of the base, or in an interior of the base.

12. An electrostatic chuck device comprising:
the electrostatic chuck member according to claim 11; and
cooling means for cooling the plate-shaped sample placed on the placing surface, wherein a plurality of projection portions supporting the plate-shaped sample are provided on the placing surface, and the cooling means supplies heat transfer gas between the plurality of projection portions.

13. The composite sintered body according to claim 1, wherein an average crystal grain size of the aluminum oxide is 0.8 µm or more and 1.2 µm or less, the crystal grains of the silicon carbide are dispersed in the crystal grains of the aluminum oxide and at grain boundaries between the crystal grains of the aluminum oxide, and the proportion of the number of crystal grains of the silicon carbide dispersed in the crystal grains of the aluminum oxide is 50% or more and 60% or less with respect to the total number of crystal grains of the silicon carbide.

14. The composite sintered body according to claim 13, wherein an average crystal grain size of the crystal grains of the silicon carbide dispersed in the crystal grains of the aluminum oxide is smaller than an average crystal grain size of the crystal grains of the silicon carbide dispersed at the crystal grain boundaries of the aluminum oxide.

15. An electrostatic chuck member comprising:

a base which includes, as a forming material, the composite sintered body according to claim 1, the base having one principal surface which is a placing surface on which a plate-shaped sample is placed; and an electrostatic attraction electrode provided on a principal surface of the base on a side opposite to the one principal surface of the base, or in an interior of the base.

16. An electrostatic chuck device comprising:

the electrostatic chuck member according to claim 15; and cooling means for cooling the plate-shaped sample placed on the placing surface, wherein a plurality of projection portions supporting the plate-shaped sample are provided on the placing surface, and the cooling means supplies heat transfer gas between the plurality of projection portions.

17. A composite sintered body which is a ceramic composite sintered body, the composite sintered body comprising:

aluminum oxide which is a main phase; and silicon carbide which is a sub-phase, wherein an average crystal grain size of the aluminum oxide is 0.8 µm or more and 1.2 µm or less, crystal grains of the silicon carbide are dispersed in crystal grains of the aluminum oxide and at grain boundaries between the crystal grains of the aluminum oxide, and a proportion of the number of crystal grains of the silicon carbide dispersed in the crystal grains of the aluminum oxide is 50% or more and 60% or less with respect to the total number of crystal grains of the silicon carbide.

18. The composite sintered body according to claim 17, wherein an average crystal grain size of the crystal grains of the silicon carbide dispersed in the crystal grains of the aluminum oxide is smaller than an average crystal grain size of the crystal grains of the silicon carbide dispersed at the crystal grain boundaries of the aluminum oxide.

19. An electrostatic chuck member comprising:

a base which includes, as a forming material, the composite sintered body according to claim 17, the base having one principal surface which is a placing surface on which a plate-shaped sample is placed; and an electrostatic attraction electrode provided on a principal surface of the base on a side opposite to the one principal surface of the base, or in an interior of the base.

20. An electrostatic chuck device comprising:

the electrostatic chuck member according to claim 19; and cooling means for cooling the plate-shaped sample placed on the placing surface, wherein a plurality of projection portions supporting the plate-shaped sample are provided on the placing surface, and the cooling means supplies heat transfer gas between the plurality of projection portions.

* * * * *